US012571971B2

(12) United States Patent
Aggarwal et al.

(10) Patent No.: US 12,571,971 B2
(45) Date of Patent: Mar. 10, 2026

(54) CONVERTING PROCESSING DIMENSIONS OF A WAFER PACKAGE

(71) Applicant: Celestial AI Inc., Santa Clara, CA (US)

(72) Inventors: Ankur Aggarwal, Pleasanton, CA (US); Anmol Rathi, San Jose, CA (US); Suresh Venkata Pothukuchi, Chandler, AZ (US)

(73) Assignee: Celestial AI Inc., Santa Clara, CA (US)

( * ) Notice: Subject to any disclaimer, the term of this patent is extended or adjusted under 35 U.S.C. 154(b) by 0 days.

(21) Appl. No.: 19/097,732

(22) Filed: Apr. 1, 2025

(65) Prior Publication Data

US 2025/0370206 A1 Dec. 4, 2025

Related U.S. Application Data

(60) Provisional application No. 63/694,684, filed on Sep. 13, 2024, provisional application No. 63/655,461, filed on Jun. 3, 2024.

(51) Int. Cl.
G02B 6/43 (2006.01)
G02B 6/12 (2006.01)
(Continued)

(52) U.S. Cl.
CPC ....... G02B 6/4239 (2013.01); G02B 6/12004 (2013.01); G02B 6/13 (2013.01); G02B 6/42 (2013.01); G02B 6/4215 (2013.01); G02B 6/4228 (2013.01); G02B 6/4243 (2013.01); G02B 6/4246 (2013.01); G02B 6/4249

(2013.01); G02B 6/4251 (2013.01); G02B 6/4255 (2013.01); G02B 6/4256 (2013.01);
(Continued)

(58) Field of Classification Search
CPC ........................................................ G02B 6/43
USPC ........................................................... 385/14
See application file for complete search history.

(56) References Cited

U.S. PATENT DOCUMENTS 7,778,501 B2 8/2010 Beausoleil et al.
7,889,996 B2 2/2011 Zheng et al.
(Continued)

FOREIGN PATENT DOCUMENTS

CN 106980160 A 7/2017
WO WO2023177417 9/2022
(Continued)

OTHER PUBLICATIONS

U.S. Appl. No. 17/807,692, filed Jun. 17, 2022, Winterbottom et al.
(Continued)

*Primary Examiner* — Kaveh C Kianni
(74) *Attorney, Agent, or Firm* — Ray Quinney & Nebeker P.C.; James S. Bullough

(57) ABSTRACT
The present disclosure relates to packaging techniques in connection with packaging electrical and optical components within circuit packages. For example, one or more examples described herein involve producing or manufacturing wafers having circuit packages formed thereon. Techniques described herein related to modifying a dimension of wafers in order that the wafers conform to a nominal dimension, such that the wafers may be implemented in connection with processing equipment that is specifically configured to operate on wafers of the nominal dimension.

10 Claims, 18 Drawing Sheets

(51) Int. Cl.

| | | |
|---|---|---|
| *G02B 6/13* | (2006.01) | |
| *G02B 6/42* | (2006.01) | |
| *H01L 23/31* | (2006.01) | |
| *H01L 23/48* | (2006.01) | |
| *H01L 23/498* | (2006.01) | |
| *H01L 23/538* | (2006.01) | |
| *H01L 25/00* | (2006.01) | |
| *H01L 25/16* | (2023.01) | |
| *H01L 25/18* | (2023.01) | |
| *H10B 80/00* | (2023.01) | |
| *H10D 80/30* | (2025.01) | |
| *H10F 55/00* | (2025.01) | |
| *H01L 23/00* | (2006.01) | |

(52) U.S. Cl.
CPC ......... *G02B 6/4259* (2013.01); *G02B 6/4274* (2013.01); *G02B 6/4278* (2013.01); *G02B 6/428* (2013.01); *G02B 6/4292* (2013.01); *G02B 6/4293* (2013.01); *G02B 6/4295* (2013.01); *G02B 6/43* (2013.01); *H01L 23/3107* (2013.01); *H01L 23/3128* (2013.01); *H01L 23/315* (2013.01); *H01L 23/481* (2013.01); *H01L 23/49816* (2013.01); *H01L 23/49827* (2013.01); *H01L 23/49838* (2013.01); *H01L 23/5384* (2013.01); *H01L 25/165* (2013.01); *H01L 25/167* (2013.01); *H01L 25/18* (2013.01); *H01L 25/50* (2013.01); *H10B 80/00* (2023.02); *H10D 80/30* (2025.01); *H10F 55/00* (2025.01); *H01L 24/08* (2013.01); *H01L 24/32* (2013.01); *H01L 2224/32225* (2013.01); *H01L 2924/1433* (2013.01); *H01L 2924/1436* (2013.01)

(56) References Cited

U.S. PATENT DOCUMENTS

| | | | |
|---|---|---|---|
| 7,961,990 | B2 | 6/2011 | Krishnamoorthy et al. |
| 8,064,739 | B2 | 11/2011 | Binkert et al. |
| 8,237,278 | B2 | 8/2012 | Gluschenkov et al. |
| 9,495,295 | B1 | 11/2016 | Dutt et al. |
| 9,791,761 | B1 | 10/2017 | Li et al. |
| 9,831,360 | B2 | 11/2017 | Knights et al. |
| 10,168,475 | B2 * | 1/2019 | Parker .............. H01L 21/76251 |
| 10,852,492 | B1 * | 12/2020 | Vermeulen ............. G02B 6/423 |
| 10,962,728 | B2 | 3/2021 | Nelson et al. |
| 10,976,491 | B2 | 4/2021 | Coolbaugh et al. |
| 11,107,770 | B1 | 8/2021 | Ramalingam et al. |
| 11,222,867 | B1 | 1/2022 | Huang et al. |
| 11,233,580 | B2 | 1/2022 | Meade et al. |
| 11,336,376 | B1 | 5/2022 | Xie |
| 11,493,714 | B1 | 11/2022 | Mendoza et al. |
| 11,500,153 | B2 | 11/2022 | Meade et al. |
| 11,509,397 | B2 | 11/2022 | Ma et al. |
| 11,817,903 | B2 | 11/2023 | Pleros et al. |
| 11,837,509 | B1 * | 12/2023 | Chou ................... H10F 71/121 |
| 12,055,766 | B2 * | 8/2024 | Pupalaikis .......... G02B 6/3628 |
| 12,148,742 | B2 * | 11/2024 | Liljeberg .............. H04B 10/40 |
| 12,191,257 | B2 | 1/2025 | Aggarwal |
| 2011/0206379 | A1 | 8/2011 | Budd |
| 2015/0354938 | A1 | 12/2015 | Mower et al. |
| 2016/0116688 | A1 | 4/2016 | Hochberg et al. |
| 2017/0045697 | A1 | 2/2017 | Hochberg et al. |
| 2017/0115458 | A1 | 4/2017 | Mekis et al. |
| 2017/0194309 | A1 | 7/2017 | Evans et al. |
| 2017/0207600 | A1 | 7/2017 | Klamkin et al. |
| 2017/0237226 | A1 | 8/2017 | Johnson et al. |
| 2017/0261693 | A1 | 9/2017 | Gambino et al. |
| 2017/0261708 | A1 | 9/2017 | Ding et al. |
| 2019/0049665 | A1 | 2/2019 | Ma et al. |
| 2019/0067037 | A1 | 2/2019 | Pelletier et al. |
| 2019/0205737 | A1 | 7/2019 | Bleiweiss et al. |
| 2019/0265408 | A1 | 8/2019 | Ji et al. |
| 2019/0317285 | A1 | 10/2019 | Liff |
| 2019/0317287 | A1 | 10/2019 | Raghunathan et al. |
| 2020/0006304 | A1 | 1/2020 | Chang et al. |
| 2020/0142441 | A1 | 5/2020 | Bunandar et al. |
| 2020/0158967 | A1 | 5/2020 | Winzer et al. |
| 2020/0200987 | A1 | 6/2020 | Kim |
| 2020/0203309 | A1 | 6/2020 | Beyne |
| 2020/0250532 | A1 | 8/2020 | Shen et al. |
| 2020/0284981 | A1 | 9/2020 | Harris et al. |
| 2021/0064958 | A1 | 3/2021 | Lin et al. |
| 2021/0132309 | A1 | 5/2021 | Zhang et al. |
| 2021/0247569 | A1 * | 8/2021 | Traverso .............. G02B 6/4212 |
| 2021/0257396 | A1 | 8/2021 | Piggott et al. |
| 2021/0266200 | A1 | 8/2021 | Yang |
| 2021/0271020 | A1 | 9/2021 | Islam et al. |
| 2021/0286129 | A1 | 9/2021 | Fini et al. |
| 2022/0091332 | A1 | 3/2022 | Yoo et al. |
| 2022/0159860 | A1 | 5/2022 | Winzer et al. |
| 2022/0171142 | A1 | 6/2022 | Wright et al. |
| 2022/0328395 | A1 | 10/2022 | Chen et al. |
| 2022/0342150 | A1 | 10/2022 | Karhade et al. |
| 2022/0342164 | A1 | 10/2022 | Chen et al. |
| 2022/0374575 | A1 | 11/2022 | Ramey et al. |
| 2022/0382005 | A1 | 12/2022 | Rusu |
| 2023/0088009 | A1 * | 3/2023 | Karhade .............. G02B 6/4243 |
| | | | 385/14 |
| 2023/0197699 | A1 | 6/2023 | Spreitzer et al. |
| 2023/0258881 | A1 | 8/2023 | Weng et al. |
| 2023/0258886 | A1 | 8/2023 | Liao |
| 2023/0308188 | A1 | 9/2023 | Dorta-Quinones |
| 2023/0314702 | A1 | 10/2023 | Yu |
| 2023/0352464 | A1 * | 11/2023 | Damaraju ............... H01L 24/80 |
| 2023/0376818 | A1 | 11/2023 | Nowak |
| 2023/0393357 | A1 | 12/2023 | Ranno |
| 2023/0395443 | A1 | 12/2023 | Lai et al. |
| 2024/0030065 | A1 * | 1/2024 | Duan ................ H01L 21/76816 |
| 2024/0030147 | A1 * | 1/2024 | Duan .................... H01L 21/486 |
| 2024/0030204 | A1 * | 1/2024 | Duan .................... H01L 21/486 |
| 2024/0036254 | A1 * | 2/2024 | Winzer .............. G02B 6/12014 |
| 2024/0097796 | A1 * | 3/2024 | Winzer ................ H04B 10/503 |
| 2024/0272385 | A1 | 8/2024 | Chen et al. |
| 2025/0062258 | A1 * | 2/2025 | Kannan ............. H01L 23/49827 |
| 2025/0167187 | A1 * | 5/2025 | Yu ............................ H01L 24/08 |
| 2025/0201793 | A1 * | 6/2025 | Suthram ................. H01L 24/05 |
| 2025/0216629 | A1 * | 7/2025 | Psaila .................. G02B 6/4243 |

FOREIGN PATENT DOCUMENTS

| | | |
|---|---|---|
| WO | WO2022266676 | 12/2022 |
| WO | WO2023177922 | 9/2023 |

OTHER PUBLICATIONS

U.S. Appl. No. 18/293,673, filed Oct. 17, 2024, Bos et al.

Agrawal, Govind; "Chapter 4—Optical Receivers", Fiber-Optic Communications Systems, John Wiley & Sons, Inc., (2002), pp. 133-182.

Eltes, Felix et al.; "A BaTiO3-Based Electro-Optic Pockels Modulator Monolithically Integrated on an Advanced Silicon Photonics Platform"; J. Lightwave Technol. vol. 37, No. 5; (2019), pp. 1456-1462.

Eltes, Felix et al.; Low-Loss BaTiO3-Si Waveguides for Nonlinear Integrated Photonics; ACS Photon., vol. 3, No. 9; (2016), pp. 1698-1703.

Harris, NC et al.; "Efficient, compact and low loss thermo-optic phase shifter in colicon"; Opt. Express, vol. 22, No. 9; (2014), pp. 10487-10493.

Hendry, G. et al.; "Circuit-Switched Memory Access in Photonic Interconnection Networks for High-Performance Embedded Computing," SC '10: Proceedings of the 2010 ACM/IEEE International Conference for High Performance Computing, Networking, Storage and Analysis, New Orleans, LA, USA, 2010, pp. 1-12.

Miller, David A. et al.; "Self-Configuring Universal Linear Optical Component"; Photon. Res. 1; [Online]; Retrieved from the interent: URL: https://arxiv.org/ftp/arxiv/papers/1303/1303.4602.pdf; (2013), pp. 1-15.

(56) References Cited

OTHER PUBLICATIONS

Raj, Mayank et al.; "Design of a 50-GB/s Hybid Integrated Si-Photonic Optical Link in 16-nm FinFET"; IEEE Journal of Solid-State Circuits, vol. 55, No. 4, Apr. 2020, pp. 1086-1095.
Zhang, Yulong; "Building blocks of a silicon photonic integrated wavelength division multiplexing transmitter for detector instrumentation" , Doktors Der Ingenieurwissenschaften (Dr.-Ing. ), Dec. 15, 2020 (Dec. 15, 2020), 128 pages.
"International Search Report and Written Opinion issued in PCT Application No. PCT/US2025/031959", Mail Date: Sep. 16, 2026, 17 pages.

* cited by examiner

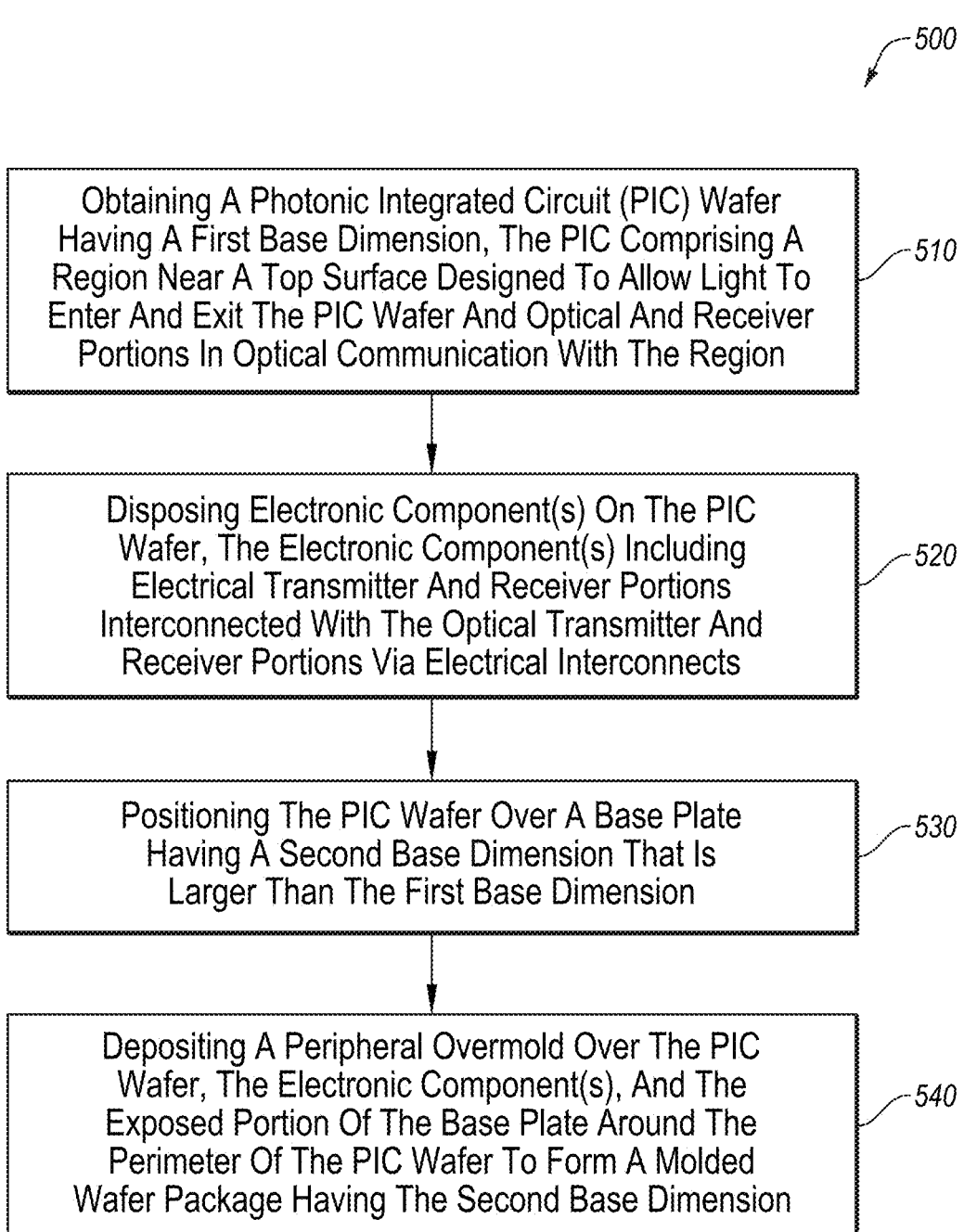

*500*

Obtaining A Photonic Integrated Circuit (PIC) Wafer Having A First Base Dimension, The PIC Comprising A Region Near A Top Surface Designed To Allow Light To Enter And Exit The PIC Wafer And Optical And Receiver Portions In Optical Communication With The Region

*510*

Disposing Electronic Component(s) On The PIC Wafer, The Electronic Component(s) Including Electrical Transmitter And Receiver Portions Interconnected With The Optical Transmitter And Receiver Portions Via Electrical Interconnects

*520*

Positioning The PIC Wafer Over A Base Plate Having A Second Base Dimension That Is Larger Than The First Base Dimension

*530*

Depositing A Peripheral Overmold Over The PIC Wafer, The Electronic Component(s), And The Exposed Portion Of The Base Plate Around The Perimeter Of The PIC Wafer To Form A Molded Wafer Package Having The Second Base Dimension

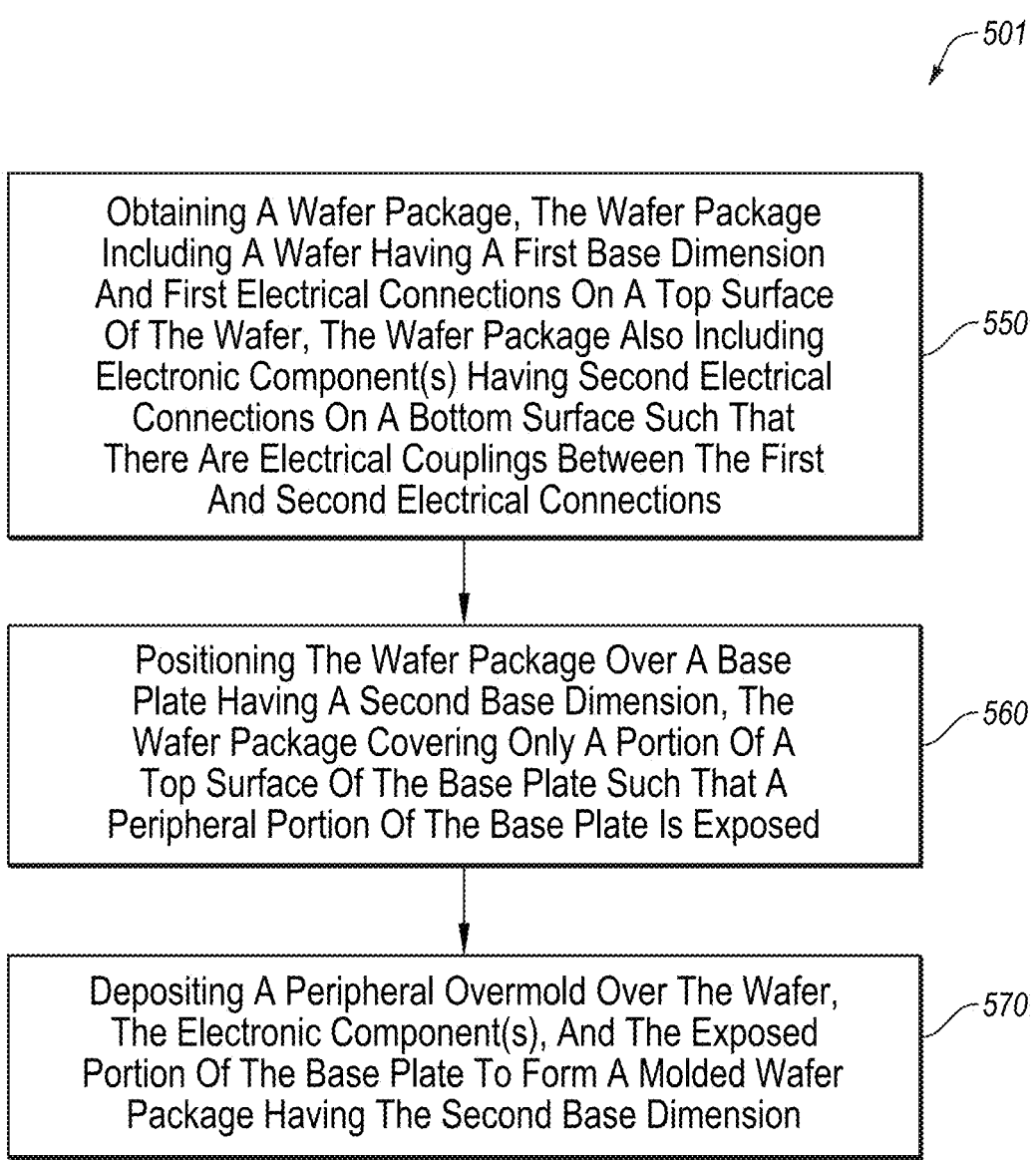

501

Obtaining A Wafer Package, The Wafer Package Including A Wafer Having A First Base Dimension And First Electrical Connections On A Top Surface Of The Wafer, The Wafer Package Also Including Electronic Component(s) Having Second Electrical Connections On A Bottom Surface Such That There Are Electrical Couplings Between The First And Second Electrical Connections

550

Positioning The Wafer Package Over A Base Plate Having A Second Base Dimension, The Wafer Package Covering Only A Portion Of A Top Surface Of The Base Plate Such That A Peripheral Portion Of The Base Plate Is Exposed

560

Depositing A Peripheral Overmold Over The Wafer, The Electronic Component(s), And The Exposed Portion Of The Base Plate To Form A Molded Wafer Package Having The Second Base Dimension

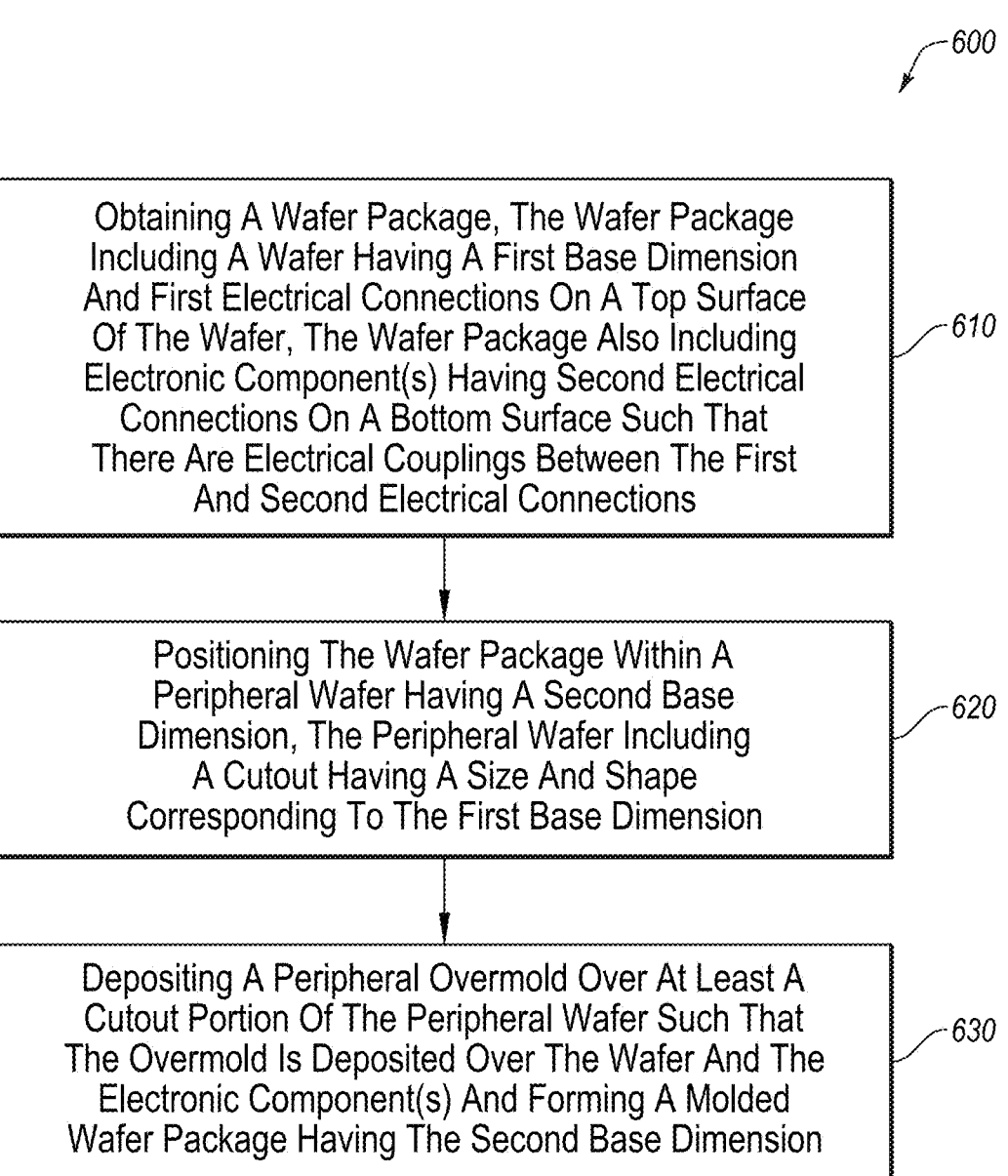

*600*

Obtaining A Wafer Package, The Wafer Package
Including A Wafer Having A First Base Dimension
And First Electrical Connections On A Top Surface
Of The Wafer, The Wafer Package Also Including
Electronic Component(s) Having Second Electrical
Connections On A Bottom Surface Such That
There Are Electrical Couplings Between The First
And Second Electrical Connections

*610*

Positioning The Wafer Package Within A
Peripheral Wafer Having A Second Base
Dimension, The Peripheral Wafer Including
A Cutout Having A Size And Shape
Corresponding To The First Base Dimension

*620*

Depositing A Peripheral Overmold Over At Least A
Cutout Portion Of The Peripheral Wafer Such That
The Overmold Is Deposited Over The Wafer And The
Electronic Component(s) And Forming A Molded
Wafer Package Having The Second Base Dimension

CONVERTING PROCESSING DIMENSIONS OF A WAFER PACKAGE

CROSS-REFERENCE TO RELATED APPLICATIONS

This application claims priority to U.S. Provisional Patent Application No. 63/655,461, entitled "PACKAGING OPTICALLY ACCESSIBLE COMPONENTS", filed on Jun. 3, 2024, the entirety of which is incorporated herein by reference. This application also claims priority to U.S. Provisional Patent Application No. 63/694,684, entitled "PACKAGING OPTICAL COMPONENTS," filed on Sep. 13, 2024, the entirety of which is incorporated herein by reference.

BACKGROUND OF THE DISCLOSURE

The subject matter discussed in this section should not be assumed to be prior art merely as a result of inclusion in this section. Similarly, any problems mentioned in this section or associated with subject matter provided as background should not be construed as an admission of prior art.

Integrated circuits (ICs) with processors, especially those for executing artificial intelligence and machine learning functions, move large amounts of data among one or more processor ICs and one or more memory ICs. Chiplets may aid in the interconnection of processor dies, memory dies, and other circuits to increase the bandwidth and decrease latency and power dissipated in the process. Chiplets can be manufactured as several circuit packages produced on a common wafer, which can then be separated into distinct chips each having a circuit package thereon.

BRIEF DESCRIPTION OF THE DRAWINGS

FIGS. 5A-5B illustrate flow diagrams for example methods or series of acts for modifying a base dimension of a wafer structure as described herein, according to one or more embodiments of the present disclosure.

FIG. 6 illustrates a flow diagram for a method or a series of acts for modifying a base dimension of a wafer structure as described herein, according to at least one embodiment of the present disclosure.

DETAILED DESCRIPTION

The present disclosure relates to example implementations of electro-photonic circuit packages, or computing packages having both electronic and photonic capabilities. Indeed, implementations herein relate to facilitating the manufacture, processing, and modification of such electro-photonic circuit packages by providing certain components (e.g., a wafer, substrate, base, support, etc.) having certain nominal or standard dimensions. For instance, the electro-photonic circuit packages described herein may be produced through various sophisticated and precise processes and/or operations, and the machinery, tools, and other equipment (e.g., processing equipment) utilized for this purpose may be specifically configured for, or compatible with, componentry having a nominal size, shape, or dimension. Accordingly, the techniques described herein may facilitate modifying an original or supply dimension of components (e.g., wafers) to a modified dimension that corresponds to the nominal dimension of the processing equipment.

As an example, in some cases, photonic integrated circuit (PIC) wafers by which the electro-photonic circuit packages are formed may be provided or supplied having a supply dimension, and the processing machinery (e.g., the processing tools) for performing one or more processes related to the manufacture of the electro-photonic circuit package, such as processes for forming through-silicon vias (TSV), are configured to operate on wafers or substrates having a nominal dimension that is larger than the supply dimension of the PIC wafers. Accordingly, the present techniques may facilitate modifying the PIC wafers such that they have the (larger) nominal dimension and may be operated on by the processing equipment. In this way, electro-photonic circuit packages may be produced by processing equipment performing sophisticated processes and precise operations on PIC wafers that are of a different dimension than that with which the processing equipment is specifically compatible. This adaptability may be particularly beneficial when considering that such sophisticated processing equipment may cost upwards of tens of millions of dollars or more. Accordingly, by adapting and/or modifying the components on which the processing equipment operates, rather than re-tooling or obtaining differently configured processing equipment that may be prohibitively expensive, the electro-photonic circuit packages may be produced using existing- and in some cases dimensionally non-compatible-processing equipment.

Figure 1:
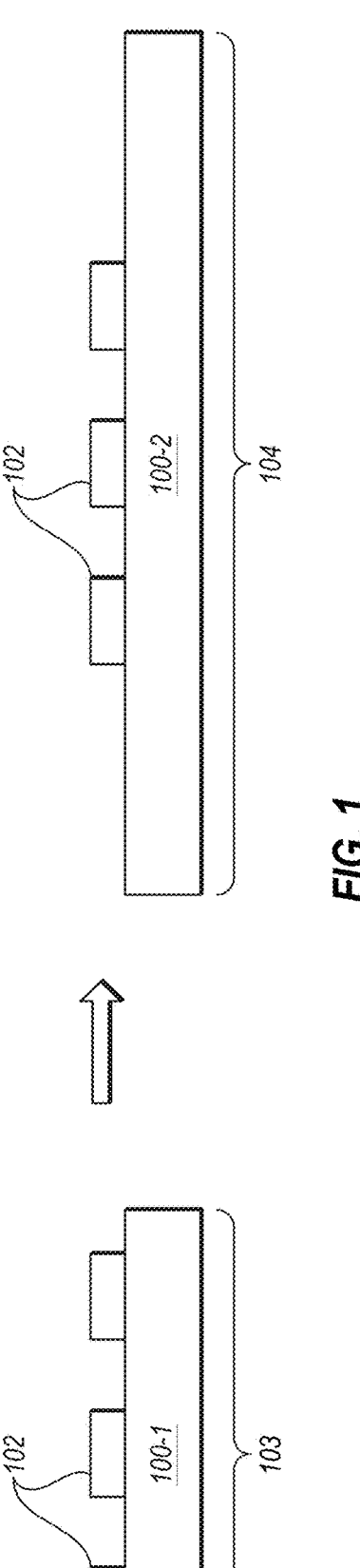
FIG. 1 illustrates an example of a wafer having a first base dimension that is converted to a wafer having a second base dimension, according to at least one embodiment of the present disclosure.

FIG. 1 illustrates an example of a wafer 100-1 having a first base dimension that is converted to a wafer 100-2 having one or more larger base dimensions, according to at least one embodiment of the present disclosure. The wafer 100-1 may be a wafer, substrate, or other structure upon which one or more dies 102 are disposed. For example, the wafer may be a photonic integrated circuit (PIC) wafer, and the dies 102 may be electronic integrated circuit (EIC) dies having electronic and/or hardware components thereon. Other configurations of wafers and wafer types may be used. In the illustrated example, electrical components of the dies 102 may be electrically coupled to photonic components in the wafer 100-1 such that one or more electro-photonic circuit packages are formed from the wafer 100-1 and dies 102. More details regarding wafers and dies, including examples that show PIC wafers, EIC dies, and electro-photonic circuit packages, are shown and described in connection with FIGS. 7A-9C.

The wafer 100-1 may have a first dimension 103 (e.g., a first base dimension), which may be representative of a dimension of the wafer 100-1, such as a length, width, diameter, or other dimension. The wafer 100-1 may be converted to form the second wafer 100-2, which may have a second dimension 104 (e.g., a second base dimension) that is larger than the first dimension 1003. For instance, the wafer 100-2 may be the same wafer as the wafer 100-1, having the same components and/or circuit packages thereon, but may exhibit a larger size or form factor.

Accordingly, the techniques described herein may facilitate modifying one or more dimensions of wafers, which may be particularly advantageous for utilizing the modified wafer with equipment configured for wafers of that particular modified dimension. For example, a size, shape, and/or dimension of a wafer may be critical for achieving precision and accuracy by processing equipment. For instance, in addition to having physically different dimensions which may present challenges associated with mounting, securing, and manipulating wafers of different sizes and/or shapes, different wafers may additionally exhibit different mechanical properties, and may react in different ways to the processes and operations performed thereon to produce different features of a completed circuit package. For instance, materials (e.g., gasses, liquids) may interact or flow differently over differently sized wafers, highlighting the importance of processing equipment and their associated processes being configured for a specific dimension of wafer. Indeed, various componentry of the processing equipment, such as mechanical, electrical, and plumbing components, may be routed, positioned, and configured based on a specific size and/or shape of wafer. Accordingly, processing equipment customized for a particular wafer dimension may not readily accommodate wafers of a different dimension. Moreover, in some cases, processing equipment for performing particular processes on one or more sizes and/or shapes of wafer may not even exist at this time.

By implementing the techniques described herein, the size, shape, and/or dimension of a wafer may be modified such that the wafer conforms to a nominal size, shape, and/or dimension compatible with the processing equipment. Accordingly, circuit packages may be completed by utilizing sophisticated processing equipment for a wide variety of different wafers.

By way of example, and as will be discussed in further detail herein, one or more wafer or wafer packages described herein may refer to wafers of a particular size or diameter, such as an eight (8) inch wafer, or a twelve (12) inch wafer. When referring to wafers of particular sizes, these sized are intended to be approximate, nominal, and/or corresponding to a particular standard. For example, as used herein, an 8-inch wafer may not necessarily be exactly eight inches in diameter, but could also correspond to a 200 mm diameter, or some measurement therebetween. Similarly, a 12-inch wafer may not necessarily be exactly twelve inches in diameter, but could also correspond to a 300 mm diameter, or some measurement therebetween. Indeed, when referring to an x-inch wafer, this may simply refer to a wafer that is sized and configured within a specific range or margin of error (e.g., a nominal size) to be processed using x-inch processing tools, which may be a different margin depending on the tools or specific dimension(s).

As many circuit packages (e.g., such as electro-photonic circuit packages as described herein) involve the combination of wafers having different sizes, or, in the least, where circuit packages often involve assembling components that are fabricated on wafers having different specifications and sizes, this can create significant problems where individuals or companies only have access to processing equipment configured to work with a specific configuration of wafer, such as a specific wafer diameter. For instance, in some cases, a PIC wafer may be provided or supplied at a first packaging dimension (e.g., eight-inch diameter), and processing equipment may be specifically configured for working with a second packaging dimension (e.g., twelve-inch diameter). This limitation in processing equipment and their ability to work across different wafer sizes and/or shapes can result in significant expenses as different tools must be purchased, configured, and programmed to work with wafers of different sizes, shapes, and/or configurations. Accordingly, by implementing the techniques disclosed here to convert or modify the packaging dimension of a wafer structure, wafers and processing equipment which may otherwise be non-conforming may nevertheless be implemented together to manufacture, produce, or complete various circuit packages.

FIGS. 2A-2G illustrate example implementations related to modifying a base dimension of a PIC wafer 200, according to at least one embodiment of the present disclosure. In one or more embodiments described herein, a packaging dimension or a base dimension refers to a physical dimension of a wafer or wafer layer. For example, a base dimension may refer to a diameter of a wafer or another dimension or size of a wafer. In one example, a packaging dimension may refer to a shape of a wafer, such as a circular shape or a rectangular, square, or other shape. In one or more examples described herein, a wafer structure having a diameter of eight inches is converted to a wafer structure having a diameter of twelve inches. It will be appreciated that other wafer structure dimensions may be applicable to different implementations.

Figures 2A, 2B, 2C:
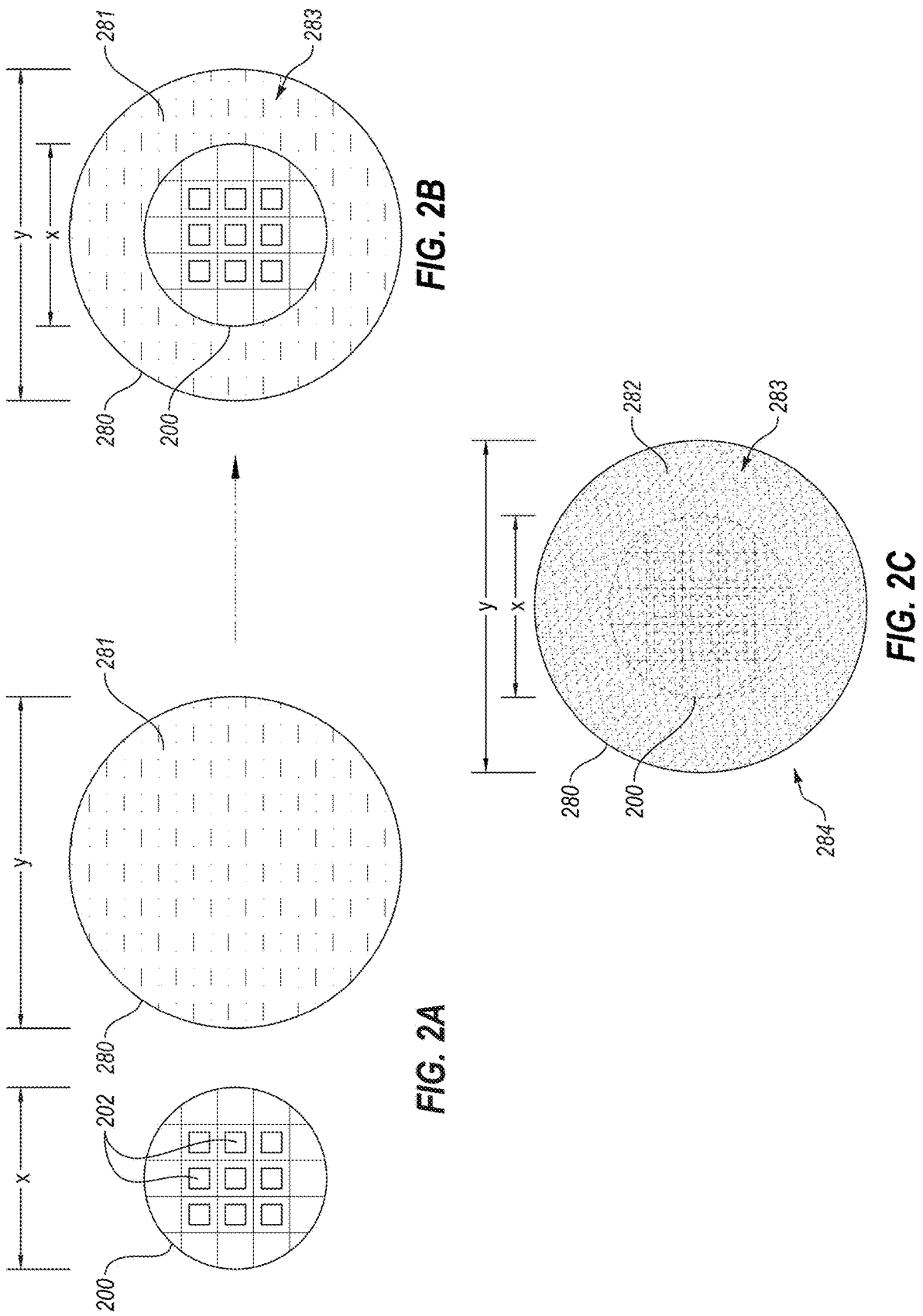
FIGS. 2A-2G illustrate example implementations related to modifying a base dimension of a wafer, according to at least one embodiment of the present disclosure.

FIG. 2A illustrates an example view of a wafer 200 and a base plate 280. The wafer 200 may be a wafer, substrate, or other base structure upon (and/or within) which one or more circuit packages may be formed. In this example, the wafer 200 may be representative of a PIC wafer (similar to PIC wafers of one or more embodiments described herein) having various photonic components positioned therein and one or more electronic components thereon, but it should be understood that the techniques described herein may be applicable to any other type or form of wafer, such as wafers in connection with circuit packages that are wholly electronic, wholly photonic, etc. In some cases, the base plate 280 may be a base component for facilitating modifying the based dimension of the wafer 200. The base plate 280 may be made of metal, glass, plastic, ceramic, or other suitable material. In some cases, the base plate 280 may be a substrate material, such as a substrate similar to the wafer 200.

In this example, the wafer 200 has a first base dimension x (e.g., eight inches in diameter) while the base plate 280 has a second base dimension y (e.g., twelve inches in diameter).

The base dimensions x, y may be representative a variety of different shapes, sizes, diameters, or other dimensions. In this example, a circular wafer 200 having a smaller, first base dimension x is contrasted against a circular base plate 280 having a larger, second base dimension y. Other shapes (e.g., squares, rectangles) may be used for either (or both) of the wafer 200 or the base plate 280. The base dimensions x, y may refer to standard or nominal dimensions in the industry. In one or more embodiments, the second base dimension y refers specifically to one or more standard or nominal dimensions that correspond to processing equipment that are configured or capable of operating in connection with components (e.g., wafers, plates, circuit packages) of the corresponding base dimension y. For example, eight-inch processing equipment may be specifically configured to operate in connection with eight-inch diameter, circular wafers, while twelve-inch processing equipment may be configured to operate in connection with twelve-inch diameter, circular wafers. It will be appreciated that tools specifically configured to operate in connection with wafers of a specific base dimension may not necessarily be usable or compatible with wafers or equipment having other base dimensions (e.g., other base sizes and/or other base shapes).

As shown in FIG. 2A, the wafer 200 may include one or more semiconductors 202 deposited thereon and/or therein. For example, the semiconductors 202 may be circuits, circuit packages, dies, chips, chiplets, etc., having any of the features and/or functionality of any of the circuit packages described herein (e.g., electro-photonic circuit packages). While the wafer 200 is shown as including a specific number and configuration of semiconductors 202, the wafer 200 may include any number of semiconductors 202 thereon, and in any layout or configuration. Indeed, one or more embodiments of the wafer 200 may include hundreds or even thousands of semiconductors 202 thereon (e.g., either the same or different circuit packages).

As shown in FIG. 2B, the wafer 200 (e.g., having semiconductors 202) may be placed over a portion of the base plate 280. In one or more embodiments, the wafer 200 is placed over a top surface 281 of the base plate 280 such that the wafer 200 covers a portion of the top surface 281 of the base plate 280 without covering an entirety of the top surface 281 of the base plate 280. For example, because the first base dimension x is smaller than the second base dimension y, the wafer 200 may be placed over the top surface 281 such that a peripheral portion 283 of the top surface 281 remains uncovered. The peripheral portion 283 may be portion or surface area of the top surface 281 that is adjacent, around, surrounding, or peripheral to the wafer 200 once the wafer 200 is positioned on the base plate 280. In some cases, the wafer 200 may be placed over the top surface 281 in an approximate center location of the base plate 280, or may otherwise be positioned on the top surface 281 in any other location. As shown, the first base dimension x of the wafer 200 may be less than the second base dimension y of the base plate.

It will be appreciated that one or more embodiments described herein refer specifically to a wafer 200 (e.g., including semiconductors 202) placed over a portion of the base plate 280. Nevertheless, other implementations may include wafers associated with other types of circuit packages (e.g., electronic circuit packages, photonic circuit packages, electro-optic circuit packages) that are placed over base plates or base substrates of larger base dimensions. Thus, while one or more embodiments described herein refer specifically to a PIC wafer—that is, a wafer in connection with electro-photonic circuit packages—other types of wafers and associated circuit packages are contemplated. Indeed, the present techniques may be applicable to any wafer of a base dimension that is placed directly over a top surface of a base plate (or other base layer) in which the wafer is of a different base dimension than the base dimension of the base plate.

As shown in FIG. 2C, once the wafer 200 is placed in position over the base plate 280, a peripheral overmold 282 may be created that encompasses, covers, and surrounds the wafer 200 and semiconductors 202. For example, a molding compound or overmolding compound may be placed over the wafer 200 and the peripheral portion 283 of the base plate 280 to generate a molded wafer package 284. The molding compound may be deposited as part of a process of manufacturing the molded wafer package 284. The molding compound may be made from a variety of materials having various properties. For example, in one or more embodiments, the molding compound is an epoxy molding compound in a liquid form that hardens and/or cures to secure elements of a circuit package in place when deposited over a surface of the circuit package.

When deposited, the molding compound covers the entire top surface of the wafer 200 including electrical components deposited thereon. More specifically, the molded wafer package 284 may be generated by depositing molding compound to cover an entire top surface of the wafer 200, including covering the semiconductors 202 of the wafer 200. The molding compound is also deposited to cover the peripheral portion 283 of the top surface 281 of the base plate 280 that is not covered by the wafer 200. In this way, the peripheral overmold 282 may include an (e.g., typical) overmold over the wafer 200, and may also include a volume of molding compound that is adjacent and peripheral to the wafer 200, at the peripheral portion 283 of the base plate 280.

In some cases, the base plate 280 is removed and is not included as part of the molded wafer package 284. For instance, the base plate 280 may function as an intermediate or temporary component for facilitating creating the peripheral overmold of the wafer 200, but may not necessarily be included as part of the (e.g., completed) molded wafer package 284. The base plate 280 may facilitate creating the peripheral overmold 282 having the dimensions and/or shape of the base plate 280. For instance, as a result of the peripheral overmold 282, the molded wafer package 284 includes a composite structure having the second base dimension y of the base plate 280, effectively creating a combined structure including the wafer 200 (including semiconductors 202), the base plate 280, and the peripheral overmold 282, where the combined structure has a same base dimension as the second base dimension y (e.g., the same base dimension as the base plate 280).

Figures 2D, 2E:
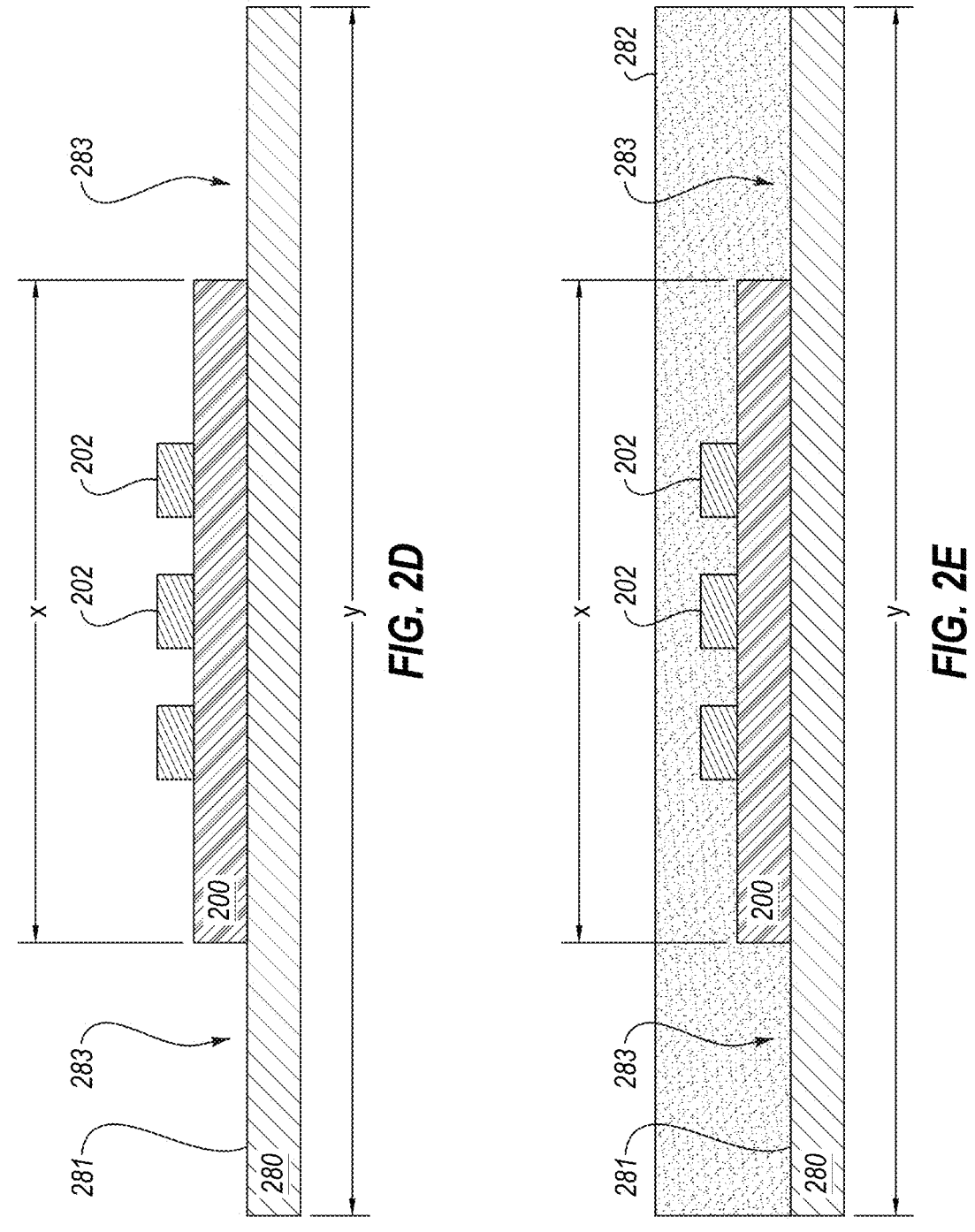

To further illustrate, FIG. 2D illustrates a side-view of the wafer 200 and the base plate 280 prior to applying the molding compound and creating the peripheral overmold 282. As shown, the base plate 280 has the second base dimension y and the wafer 200 has the first base dimension x.

FIG. 2E illustrates a side-view of the wafer 200 and the base plate 280 after applying the molding compound over the surfaces of the base plate 280 and wafer 200. In particular, as shown in FIG. 2E, the peripheral overmold 282 formed by the molding compound covers an entire top portion (e.g., top surface) of the wafer 200 (e.g., including covering the semiconductors 202) and some of the molding compound is deposited on the peripheral portion 283 of the base plate 280 that is not covered by the wafer 200. In this way, the peripheral overmold 282 is positioned both on top of (e.g., over or covering) the wafer 200, as well as adjacent and peripheral to the wafer 200. This results in the peripheral overmold 282 having the same base dimension as the second base dimension y of the base plate 280, and accordingly, the wafer 200 may be considered as having a modified based dimension that is the same as the second base dimension y.

Figures 2F, 2G:
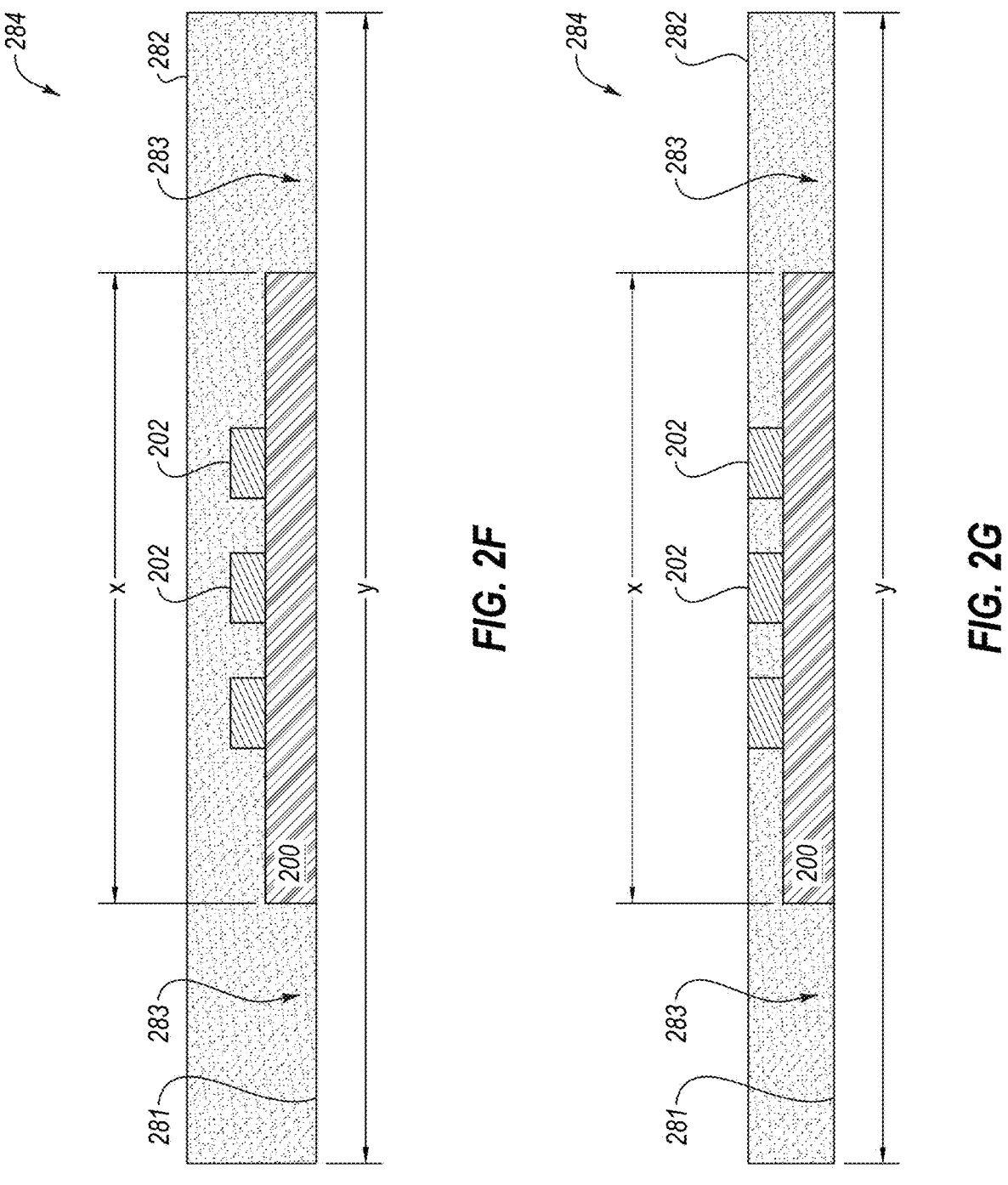

As shown in FIG. 2F, a completed molded wafer package 284 may be generated by removing the base plate 280. For example, after applying the molding compound, the base plate 280 may be removed from the wafer 200 and peripheral overmold 282 resulting in an overmolded compound structure including the molding compound and the wafer 200. The molded wafer package 284 exhibits the second base dimension y of the base plate 280. Thus, rather than having the first base dimension x corresponding to the wafer 200, the base dimension of the molded wafer package 284 now has the second base dimension y of the base plate 280, even after the base plate 280 is removed.

As shown in FIG. 2G, in some cases, the molded wafer package 284 has a layer or portion removed. For example, some of the overmold 282 may be grinded, such as to produce the molded wafer package 284 having a specific thickness dimension. The grinding of the molded wafer package 284 may be in accordance with the grinding techniques shown and described in connection with FIGS. 4A-4B below.

FIGS. 3A-3F illustrate another example of modifying a base dimension of a wafer 300, according to at least one embodiment of the present disclosure. The wafer 300 may include some or all of the features and functionalities discussed above in connection with wafer 200 shown in FIGS. 2A-2G. For example, the wafer 300 includes one or more circuit packages 302 disposed or formed on and/or in the wafer 300, and has a first base dimension a.

In some cases, the base dimension of the wafer 300 may be modified based on implementing a peripheral wafer 380. The peripheral wafer 380 may be a component or structure formed of a substrate material, such as a silicon or other medium. In some cases, the peripheral wafer 380 is a substrate of the same material as the wafer 300.

The peripheral wafer 380 has a second base dimension b. The second base dimension b may be larger than the first base dimension of the wafer 300. For example, in some cases, the first base dimension a is 8 inches and the second base dimension b is 12 inches. In the example shown, the wafer 300 and the peripheral wafer 380 are both shown as circular. In one or more embodiments, the techniques for modifying the base dimension of the wafer 300 may also be applicable to other shapes of PIC wafers and/or peripheral wafers.

The peripheral wafer 380 may be formed with a cutout 381. For example, a portion of the peripheral wafer 380 may be removed or otherwise formed around the cutout 381 such that the peripheral wafer 380 forms a hollow or open shape. In some cases, the peripheral wafer 380 may be considered as having the shape of an annulus, or ring. The cutout 381 may be substantially the same shape and size at the wafer 300. For example, the cutout 381 may span a dimension that is within 2 mm of the base dimension a. In some cases, the cutout 381 is centered or concentric with the peripheral wafer 380, or the cutout 381 may be otherwise positioned. While the cutout 381 is shown and described as being circular, it should be understood that the cutout 381 may be any shape corresponding to the shape of the wafer 300.

Figures 3A, 3B, 3C:
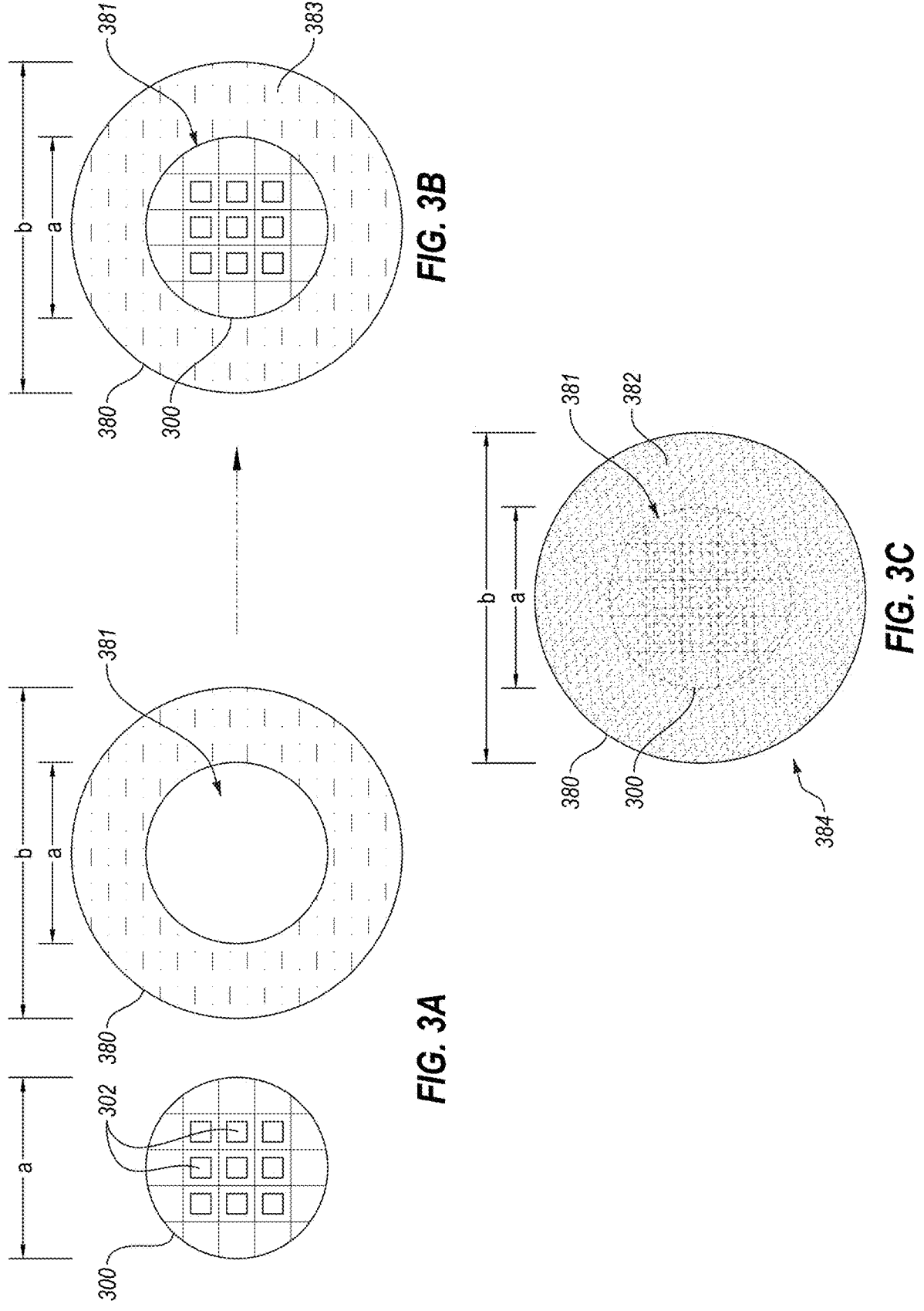
FIGS. 3A-3F illustrate another example of modifying a base dimension of a wafer, according to at least one embodiment of the present disclosure.
Figures 3D, 3E:
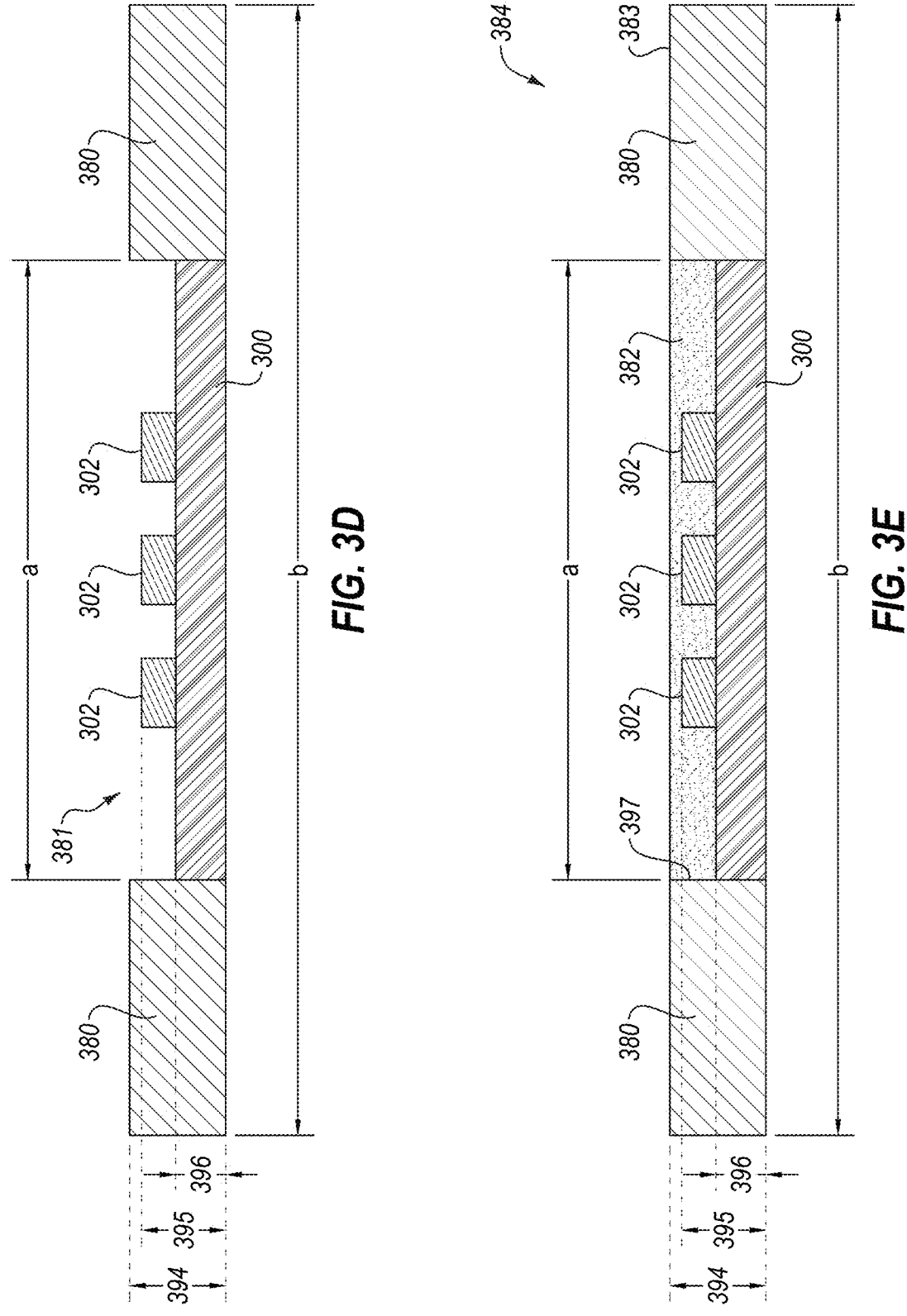

As shown in FIG. 3B, the wafer 300 may be positioned within the peripheral wafer 380 by positioning the wafer 300 in the cutout 381. For example, as shown in the side cross-sectional view of FIG. 3D, the wafer 300 may be positioned within the cutout 381 such that a bottom surface of the wafer 300 and a bottom surface of the peripheral wafer 380 are flush or coplanar. In this way, the wafer 300 may not necessarily be positioned on the peripheral wafer 380, but rather within the peripheral wafer 380 such that the peripheral wafer 380 is adjacent and peripheral to the wafer 300.

In some cases, the peripheral wafer 380 may have a thickness 394 that is thicker than a thickness 396 of the wafer 300. For example, when the wafer 300 is positioned in the cutout 381, the peripheral wafer 380 may extend the thickness 394 which may be greater than the thickness 396 of the wafer 300. In some cases, the peripheral wafer 380 has the thickness 394 that is greater than the thickness 396 based on the peripheral wafer 380 being a thicker wafer, or being formed of a thicker substrate. In some cases, the peripheral wafer 380 may be formed of multiple wafers (e.g., multiple substrates) layered or joined in order to achieve the greater thickness 394. For example, in some cases the peripheral wafer 380 may be formed from two or more wafers that individually have a thickness the same as or similar to the thickness 396 of the wafer 300, and which are layered or joined to form the peripheral wafer 380 having the thickness 394. For instance, multiple (thinner) wafers may be stacked and adhered together to form the peripheral wafer 380 of the thickness 394.

In some cases, a thickness 395 corresponds to a thickness of the circuit packages 302. For example, the thickness 395 may correspond with a thickness of the wafer 300 (e.g., the thickness 396) and the circuit packages 302 disposed on the wafer 300. In some embodiments, the thickness 394 of the peripheral wafer 380 is the same as the thickness 395 of the circuit packages 302. In some cases, the thickness 394 of the peripheral wafer 380 is greater than the thickness 395 of the circuit packages 302.

As shown in FIG. 3C, a molded wafer package 384 may be created by applying a molding component to wafer 300 positioned within the peripheral wafer 380. For instance, an overmold 382 may be formed over the wafer 300 and within the cutout 381. The overmold 382 may be disposed on the wafer 300 such that it covers the top surface of the wafer 300, including the circuit packages 302 of the wafer 300. In some cases, the overmold 382 is not positioned or applied to a top surface 383 of the peripheral wafer 380. For example, as shown in the side cross-sectional view of FIG. 3E, the overmold 382 may be applied and positioned such that it covers the wafer 300 within the cutout 381, but does not extend out of the cutout 381 onto the top surface 383 of the peripheral wafer 380. The overmold 382 may contact and/or cover an inside surface 397 of the peripheral wafer 380, for example, such that the overmold 382 may be joined, adhered, or connected to the peripheral wafer 380 at the inside surface 397.

In this way, the molded wafer package 384 may be generated, which may be inclusive of the wafer 300 (and associated circuit packages 302), the overmold 382, and the peripheral wafer 380. For example, the overmold 382 may be adhered or joined to both the wafer 300 and the peripheral wafer 380 such that all of these components are connected and/or integral, and such that the molded wafer package 384 comprises a compound molded structure inclusive of the peripheral wafer 380. For instance, the peripheral wafer 380 may not be removed like that of the base plate as described in connection with FIGS. 2A-2F.

In some cases, the overmold 382 may be disposed to a thickness equal to that of the thickness 394 of the peripheral wafer 380. For example, the molding compound may be disposed on top of the wafer 300 and within the cutout 381 such that the molding compound is made to fill the cutout 381 up to the top surface 383. In this way, the resulting overmold 382 may extend (e.g., from the wafer 300 and associated circuit packages 302) to the top surface 383, or the thickness 394. In some cases, the overmold 382 may be made to extend a different thickness than the thickness 394. For example, the molding compound may be disposed within the cutout 381, but may not entirely fill the cutout 381 up to the to surface 383. For instance, the overmold 382 may not extend entirely to the thickness 394 of the peripheral wafer 380. In some cases, one or more of the circuit packages 302 (e.g., or one or more electrical components (dies) of a circuit package) may be partially or entirely exposed through the overmold 382. The overmold may be formed in this way to facilitate providing access to one or more electrical components, such as for providing connectability to these components, or for thermal considerations of these components.

Figure 3F:
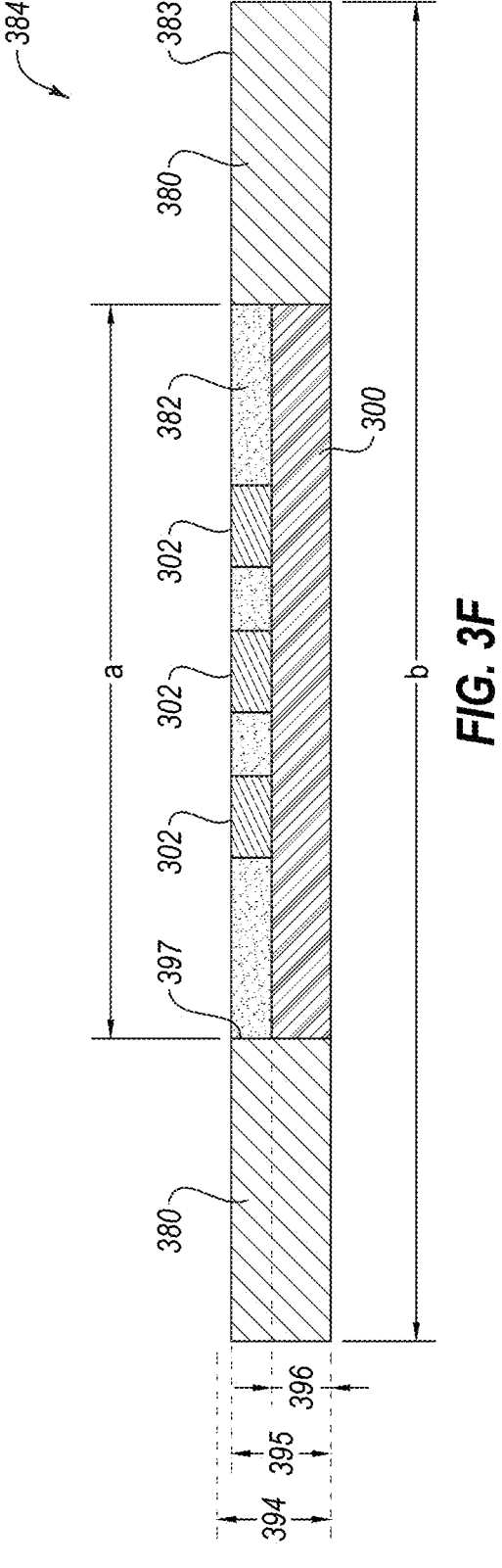

As shown in FIG. 3F, in some cases, the molded wafer package 384 has a layer or portion removed. For example, some of the overmold 382 and peripheral wafer 380 may be grinded, such as to produce the molded wafer package 384 having a specific thickness dimension. The grinding of the molded wafer package 384 may be in accordance with the grinding techniques shown and described in connection with FIGS. 4A-4B below.

Accordingly, the molded wafer package 384 may be generated to have the larger, second base diameter b, based on the peripheral wafer 380 being joined to the wafer 300. This may be advantageous, as described herein, in order to accommodate utilizing the wafer 300 with processing equipment which may be configured specifically for the second base dimension b.

Moreover, forming the molded wafer package 384 based on the addition of the peripheral wafer 380 may provide additional benefits. For example, in some cases molding compounds utilized to create the overmolds (e.g., or peripheral overmolds) may undergo thermal contraction and/or expansion to a certain degree as the molding compound sets, cures, and hardens. Because the overmold is joined to the PIC wafer, and because a PIC wafer may not experience thermal contraction/expansion (or at least not to the same degree), the overmold joined to the PIC wafer may cause the PIC wafer and resulting molded wafer package to bend or warp as the overmold thermally expands/contracts. This can be problematic as a substantially planar or flat wafer is typically required for achieving precision and accuracy during further processing of the wafer. Further, bending of the wafer can exert undesirable stresses on the wafer, which may tend to break or damage the wafer and associated components of the wafer. Accordingly, in some cases, dimension modification techniques which rely on using an overly large volume of molding compound may present challenges related to thermal expansion/contraction.

The molded wafer package 384 as just describe may advantageously provide a modified base dimension and may additionally mitigate the challenges associated with thermal expansion/contraction of the molding compound. For instance, because the modification of the base dimension is achieved based on the peripheral wafer 380 having the desired base dimension (e.g., rather than achieving the modified base dimension with the molding compound), and the overmold 382 is limited to being disposed within the cutout 381, the resulting molded wafer package 384 may be created with considerably less molding compound. Accordingly, the molded wafer package 384 may experience thermal expansion/contraction to a lesser degree, which may facilitate maintaining the molded wafer package 384 planar, as well as maintaining the mechanical integrity of the wafer 300. Accordingly, by modifying the base dimension with the peripheral wafer, the resulting molded wafer package may remain sufficiently flat and/or planar such that further processing operations can be performed accurately.

The techniques described with respect to FIGS. 2A-3F have been shown and described with respect to modifying a diameter of a circular wafer to have a larger diameter of a resulting circular molded wafer package. It should be understood, however, that these techniques are equally applicable to modifying another dimension or form of a wafer, including modifying a shape of a wafer. For example, in some cases a length or width of a square or rectangular wafer may be modified to have a larger length or width of a resulting square or rectangular molded wafer package. In another case, a circular (or other shaped) wafer may be modified to create a resulting molded wafer package of a different shape (e.g., and having one or more different dimensions). Any of these examples may be achieved based on using the technique associated with a peripheral overmold created on a base plate, as well as the technique of using a peripheral wafer with a cutout. In this way, a molded wafer package may be generated for accommodating many different shapes and/or sizes of wafers to different sized and/or shaped molded wafer packages, such that the same may be processed by processing equipment having a specific shape and/or size requirement. Indeed, in this way, wafers may be processed, operated on, tested, or otherwise interacted with by utilizing processing equipment having considerable precision and sophistication notwithstanding the wafer not originally conforming the a given processing equipment.

Figure 4A:
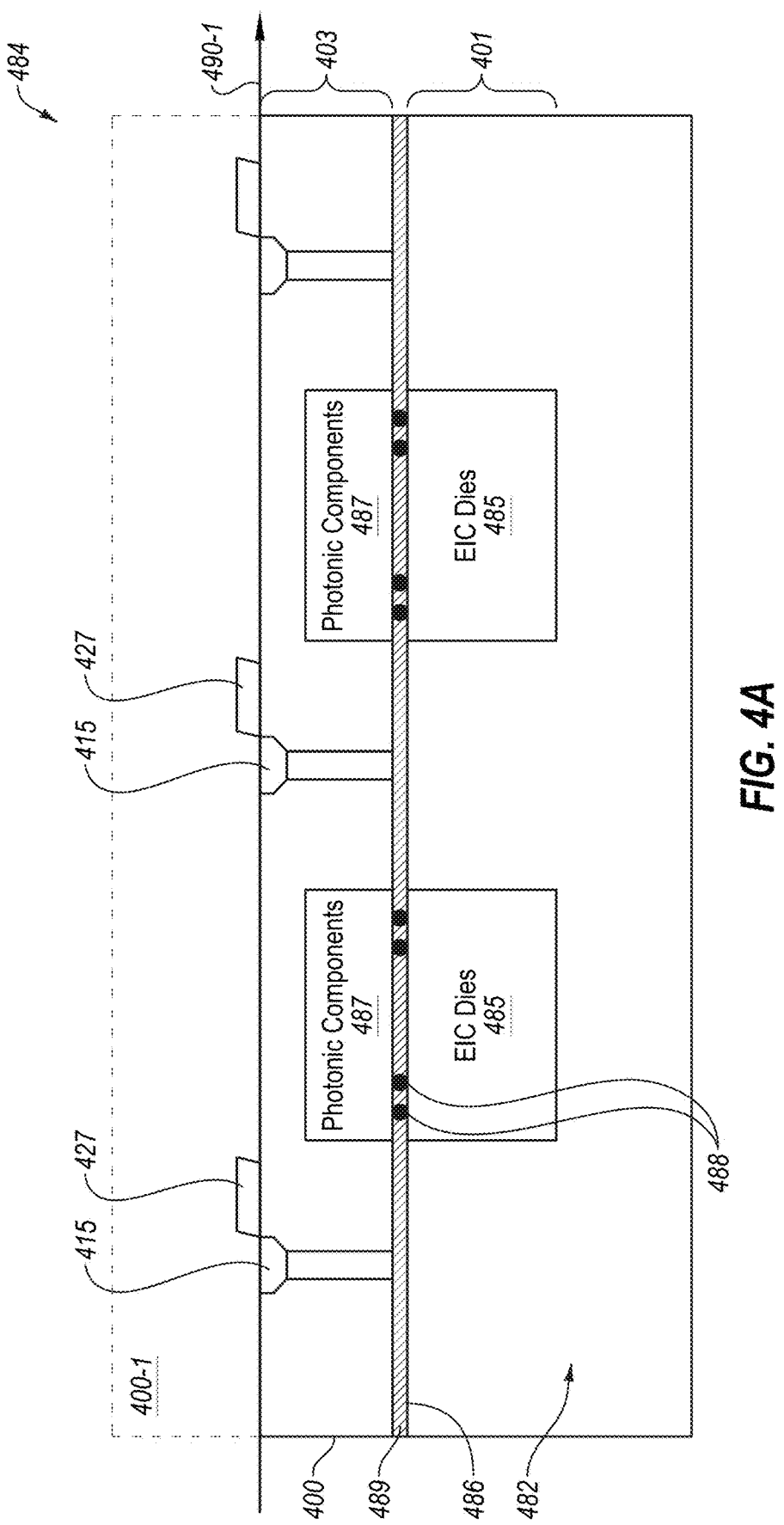
FIGS. 4A and 4B illustrate a portion of an example molded wafer package, according to at least one embodiment of the present disclosure.
Figure 4B:
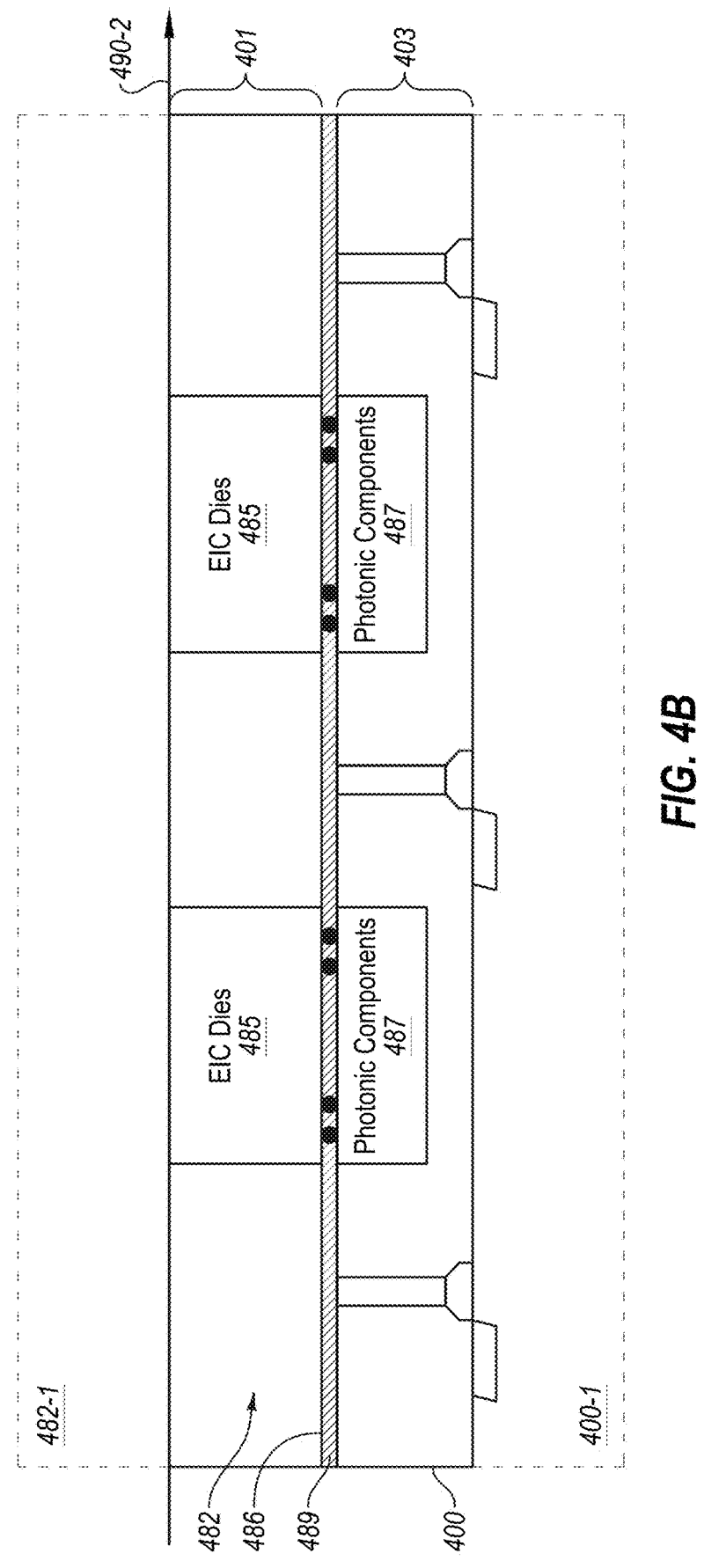

FIGS. 4A and 4B illustrate a portion of a molded wafer package 484, according to at least one embodiment of the present disclosure. The molded wafer package 484 may be substantially similar to any of the molded wafer packages described in connection with FIGS. 2A-3F. For example, the molded wafer package 484 includes a PIC wafer 400. The PIC wafer 400 may include one or more photonic components 487 disposed therein and/or thereon, as well as one or more EIC dies 485 disposed on a surface of the PIC wafer 400. The PIC wafer 400, the photonic components 487, and EIC dies 485 may be representative of any of the components and/or configurations of PIC wafers and circuit packages and may include features and characteristics as described below in connection with FIGS. 7A-9C. For instance, the EIC dies 485 may be representative of electrical components disposed on the PIC wafer 400, such as electrical hardware components, computing components, electrical interfaces, trans-impedance amplifiers, drivers, or other electronic components. These electrical components may form an EIC layer 401 of the molded wafer package 484. The photonic components 487 may be representative of photonic modulators, photodiodes, splitters, multiplexers, Demultiplexers, waveguides, or other photonic components. In some cases, the PIC wafer 400 includes one or more grating couplers or grating coupler regions for coupling to fiber array units to facilitate off-chip signal transmission as described herein. Similarly, the PIC wafer 400 may include one or more edge couplers as described herein. The photonic components 487 may form a PIC layer 403 of the molded wafer package 484. In this way, the molded wafer package 484 may be a PIC wafer and/or electro-photonic circuit package as described herein (e.g., such as that of FIGS. 7A-9C), having an overmold applied thereto as described above in connection with FIGS. 2A-3F.

It will be appreciated that EIC dies 485 may be deposited, placed, or positioned on the PIC wafer 400 prior to the dimension modification techniques described above, such as before placing the PIC wafer 400 on a base plate and applying the overmold 482, or before placing the PIC wafer 400 in a peripheral wafer and applying the overmold 482. The EIC dies 485 may be placed in accordance with a bump map on top of the PIC wafer 400 or in accordance with other configurations that enable electrical components to be connected or otherwise coupled to photonic components formed within the PIC wafer 400. The PIC wafer 400, photonic components 487, and EIC dies 485 may be representative of any of the components and configurations of circuit packages as described in one or more embodiments herein.

The view illustrated in FIGS. 4A and 4B of the molded wafer package 484 may be zoomed in or focused on a small collection of components of the PIC wafer 400, represented as a collection of the EIC dies 485. Accordingly, these figures illustrate a portion of the molded wafer package 484 corresponding to a portion of the PIC wafer 400 over which individual EIC dies 485 are deposited. For ease in explanation, FIGS. 4A and 4B no longer correspond to the base dimensions, but are provided to show one or more processes performed to the molded wafer package 484 (e.g., after the base dimension has been modified in accordance with any of the techniques described herein). Additionally, the view of the molded wafer package 484 in FIG. 4A may be flipped or upside down to that of FIGS. 2A-3F. For example, in some cases, after forming the molded wafer package 484 as described herein, the molded wafer package 484 may be flipped over such that one or more processes or operations may be performed on the molded wafer package 484 with the PIC wafer 400 facing upward.

The EIC dies 485 may refer to a variety of components including, by way of example, high bandwidth memory (HBM) devices, processing dies, and any other electrical components. Examples of one or more of these components are discussed below in connection with FIGS. 7A-9C, which may similarly be implemented in the examples shown in FIGS. 4A-4B (as well as other examples discussed herein). The EIC dies 485 may be disposed on a top surface 486 of the PIC wafer 400 and may connect to one or more photonic components 487 within the PIC wafer 400. For instance, the EIC dies 485 may be electrically connected to the PIC wafer 400 via one or more interconnects 488.

In some cases, the interconnects 488 may be solder bumps, copper pillars, or other interconnects for connecting the EIC dies 485 to one or more of the photonic components 487 disposed in the PIC wafer 400 similar to one or more embodiments discussed in connection with non-limiting examples described herein. Indeed, in one or more embodiments, a top surface of the PIC wafer 400 may include interconnects 488 in the form of bumps or other contacts that are spaced apart in an array or pattern of bumps that correspond to placement of pads or other contacts on a bottom surface of the EIC dies 485. These bumps may be arranged in a grid or with individual groupings that are configured to mate or come into contact with corresponding pads or bumps on the EIC dies. In this manner, when an EIC die is placed in position over a top surface of a PIC such that the bumps (or other form of electrical contacts) of the PIC and pads (or other form of electrical contacts) on the EIC can connect to one another and electrically couple components between the respective packages. As indicated herein, examples of components that are coupled to one another via these interconnects 488 are discussed in further detail in connection with illustrated examples below.

In some embodiments, the EIC dies 485 and the photonic components 487 are connected via a redistribution layer (RDL) 489 in the PIC wafer 400. For instance, the RDL 489 may be a layer (or multiple layers) within the substrate of the PIC wafer 400 which may direct, rout, and/or distribute electrical signals in any manner between one or more locations and/or between one or more connected components. The RDL 489 may include metal layers, traces, or other conductive elements which may facilitate connecting various components (e.g., of photonic components 487 and/or of the EIC dies 485) through an electrical connection. Accordingly, in some cases, the EIC dies 485 and/or the photonic components 487 may be connected via the RDL 489. In some cases, various components of the photonic components 487 and the EIC dies 485 may be more directly connected (e.g., not via the RDL 489) such as through a copper pillar directly connecting these components. An example of such a case may be a photodiode directly connected to an associated transimpedance amplifier as described herein, or a modulator directly connected to an associated driver as described herein.

In some cases, the molded wafer package 484 may be operated on to perform a grinding process 490-1 of the PIC wafer 400. For example, in some cases, after a base plate is removed from the bottom surface of the PIC wafer 400, a layer 400-1 of the PIC wafer 400 may be grinded, milled, etched, or otherwise removed from the PIC wafer 400. In some cases, a portion of the overmold 482 (e.g., a peripheral overmold) is positioned adjacent and peripheral to the PIC wafer 400, and a corresponding portion of the overmold 482 may also be removed. Thus, the layer 400-1 may include some of the PIC wafer 400 and some of the overmold 482. In another case, a peripheral wafer may be positioned adjacent and peripheral to the PIC wafer 400, and a corresponding portion of the peripheral wafer may be removed as part of the layer 400-1.

The removal of the layer 400-1 may facilitate a thickness of the molded wafer package 484 being sized and/or packaged according to any specific design or configuration, such as having a desired thickness. For instance, the PIC wafer 400 may have a thickness that varies greatly from one embodiment to another (e.g., from one supplied wafer to another). By way of example and not limitation, in one or more implementations, the PIC wafer 400 may have a thickness of approximately 600 to 1000 microns prior to the grinding process 490-1, and the PIC wafer 400 (and corresponding portion of the overmold 482 or peripheral wafer) may be grinded to a desired thickness of less than 100 microns. In one or more embodiments, the desired thickness is less than 60 microns.

In one or more embodiments, the desired thickness is determined based on a location of components within the PIC wafer 400 that will be used in facilitating communication between electrical components of one or more final circuit packages. For example, in some cases, the photonic components 487 may be positioned within a specific 60 micron range of thickness (e.g., from the top surface 486 of the PIC wafer 400), and the PIC wafer 400 may be grinded to remove additional or excess material (substrate) such that the PIC wafer is closer in thickness to the 60 micron range. For example, in some cases the PIC wafer 400 may be grinded to a 100 micron thickness to allow for some space or room for error in the grinding process 490-1. It will be appreciated that this stage of grinding can have flexibility in the specific thickness of the resulting package so long as the functional components of the PIC wafer are not removed or damaged in the grinding process. For instance, in some cases the PIC wafer 400 may include photonic components 487 at any range of thickness, and the grinding process 490-1 may accordingly grind the PIC wafer 400 to any corresponding thickness.

In some embodiments, the grinding process 490-1 may facilitate establishing a planar and/or square surface of the molded wafer package 484. For example, manufacturing tolerances of the PIC wafer 400 may be such that the PIC wafer 400 may not have an entirely flat, square, and/or planar surface. In other cases, the overmolding process may cause the PIC wafer 400 to warp, such as due to thermal expansion and/or contraction of the molding compound relative to the PIC wafer 400. Accordingly, the grinding process 490-1 may advantageously facilitate creating a flat, planar surface of the molded wafer package 484.

In some cases, one or more TSVs 415 may be formed in the PIC wafer 400. For example, the TSV-forming processes may be performed on the molded wafer package 484 to form the TSVs 415, either partially or entirely through the PIC wafer 400. The TSVs 415 may be added at this stage to provide power to the electrical components on the PIC wafer 400. For instance, one or more TSVs 415 may be connected to the RDL 489 and/or (e.g., directly) to one or more of the EIC dies 485. In addition, interconnects 427 (e.g., bumps, copper pillars) may be added and connected to the TSVs 415. For instance, the interconnects 427 may provide a contact point such that the TSVs 415 may serve as an electrical interconnect between an electrical component coupled to the interconnects 427 (e.g., a power source or other component) and an associated EIC die 485.

As shown in FIG. 4B, in some cases a grinding process 490-2 is implemented for removing a layer 482-1 of the overmold 482. For instance, the grinding process 490-2 may include grinding, milling, etching, or otherwise removing the layer 482-1. In cases where the PIC wafer 400 is positioned within a peripheral wafer, some of the peripheral wafer may be included in the layer 482-1, and may accordingly be removed in the grinding process 490-2. The grinding process 490-2 may be performing before or after the grinding process 490-1, the forming of the TSVs 415, etc. In some cases, the molded wafer package 484 may (again) be flipped such that the PIC wafer 400 is positioned downward.

In some cases, the layer 482-1 is removed (grinded) to reduce a thickness of the overmold 482 based on one or more of the EIC dies 485. For example, based on a thickness of the EIC dies 485, the layer 482-1 may be removed so that the thickness of the overmold 482 is closer, near, or at one or more of the EIC dies 485. For instance, one or more of the EIC dies 485 may be exposed through the peripheral overmold by removing the layer 482-1. Removal of the layer 482-1 in this way may facilitate providing cooling of the EIC dies, access to the EIC dies, 485 and/or may facilitate flattening a surface of the overmold 482.

In some cases, one or more of these processes just mentioned (e.g., any of the grinding processes 490-1, 490-2, the forming of TSVs 415, connecting the interconnects 427, etc.) may be performed or carried out by processing equipment that may be specifically configured to operate based on the modified base dimension of the molded wafer package 484. Thus, by adapting the PIC wafer 400 to have a corresponding (e.g., larger) base dimension as described herein, the molded wafer package 484 may be advantageously used in connection with larger-dimension processing equipment to achieve the considerable precision required for these sophisticated processes.

In some embodiments, various components included on/in the molded wafer package 484 may form one or more circuit packages, and the molded wafer package 484 may accordingly be diced or separated to create discrete circuit packages. These circuit packages may be electro-photonic circuit packages. For instance, the molded wafer package 484 may include various components disposed within the PIC layer 402. The PIC layer 402 and associated components may be implemented at, on, or within the PIC wafer 400, and may include various photonic components 487 disposed therein. Various electronic components or EIC dies 485 may be disposed on a surface of the PIC wafer 400 which comprises the EIC layer 401. For instance, the EIC layer 401 is shown as two EIC dies 485, but it should be understood that the EIC layer 401 may include any number of electronic components, including one or more processing components, memory components, storage components, or any other electronic or hardware component as described herein. Indeed, in one or more embodiments described herein, the EIC layer 401 may refer to a layer of any number of electrical components, and which may be deposited or otherwise placed in connection with the PIC layer 402. The EIC dies 485 may operate in an electronic domain and may communicate through a photonic domain via the various photonic components 487 of the PIC layer 402.

FIGS. 5A-6 illustrates flow diagrams showing example methods or series of acts for modifying a base dimension of a wafer structure in accordance with one or more embodiments described herein. While FIGS. 5A-6 illustrates acts according to example embodiments, alternative embodiments may add to, omit, modify, or reorder any of the acts shown and described in connection with FIGS. 5A-B.

As shown in FIG. 5A, the series of acts 500 includes an act 510 of obtaining a photonic integrated circuit (PIC) wafer having a first base dimension, the PIC comprising a region near a top surface designed to allow light to enter and exit the PIC wafer and optical and receiver portions in optical communication with the region. In one or more embodiments, the act 510 includes obtaining a photonic integrated circuit (PIC) wafer having a first base dimension, the PIC wafer including a region near a top surface of the PIC wafer designed to allow light to enter and exit the PIC wafer and optical transmitter and receiver portions in optical communication with the region, the optical transmitter and receiver portions having electrical interconnects to the top surface of the PIC wafer in a portion that does not extend into the region.

As shown in FIG. 5A, the series of acts 500 includes an act 520 of disposing electronic component(s) on the PIC wafer, the electronic component(s) including electrical transmitter and receiver portions interconnected with the optical transmitter and receiver portions via electrical interconnects. In one or more embodiments, the act 520 includes disposing one or more electronic components on the PIC wafer, the one or more electronic components including electrical transmitter and receiver portions interconnected with the optical transmitter and receiver portions via electrical interconnects, forming electro-optical paths to and from the one or more electronic components to region.

As shown in FIG. 5A, the series of acts 500 includes an act 530 of disposing one or more electronic components on the PIC wafer, the one or more electronic components including electrical transmitter and receiver portions interconnected with the optical transmitter and receiver portions via electrical interconnects, forming electro-optical paths to and from the one or more electronic components to region. In one or more embodiments, the act 530 includes positioning the PIC wafer over a base plate having a second base dimension that is larger than the first base dimension, wherein the PIC wafer covers only a portion of a top surface of the base plate such that a peripheral portion of the top surface of the base plate is exposed around a perimeter of the PIC wafer.

As shown in FIG. 5A, the series of acts 500 includes an act 540 of depositing a peripheral overmold over the PIC wafer, the electronic component(s), and the exposed portion of the base plate around the perimeter of the PIC wafer to form a molded wafer package having the second base dimension. In one or more embodiments, the act 540 includes depositing a peripheral overmold over the PIC wafer, the one or more electronic components, and the exposed portion of the base plate around the perimeter of the PIC wafer to form a molded wafer package having the second base dimension.

In one or more embodiments, the series of acts 500 includes an act of removing the base plate from the molded wafer package such that the molded wafer package, after removal from the base plate, has the second base dimension. In one or more embodiments, the series of acts 500 includes an act of removing a layer of the molded wafer package to expose the one or more electronic components disposed on the wafer. In one or more embodiments, removing the layer of the molded wafer package exposes an optical path to a grating coupler region of the plurality of grating coupler regions near the top surface of the PIC wafer. In one or more embodiments, the series of acts 500 includes coupling an optical fiber to a grating coupler in the region using an optical interface component. In one or more embodiments, the optical interface component is a fiber array unit (FAU).

In one or more embodiments, the series of acts 500 includes performing processing tasks on the molded wafer package using processing equipment configured to process components on a wafer structure having the second base dimension. In one or more embodiments, the processing tasks include forming through-silicon vias (TSVs) in the PIC wafer and forming interconnects on the PIC wafer connected to the TSVs for providing electrical power to the one or more electronic components.

In one or more embodiments, a shape of the first base dimension is a circle having a diameter of approximately eight inches. In one or more embodiments, the second base dimension is a circle having a diameter of approximately twelve inches such that the molded wafer package is a circular wafer package having a base dimension of approximately twelve inches.

In one or more embodiments, the PIC wafer includes waveguides formed within the PIC wafer and passing between the region and the optical transmitter and received portions. In one or more embodiments, the PIC wafer includes bumps on the top surface of the PIC wafer coupling one or more components within the PIC to the one or more electronic components disposed on the top surface of the PIC wafer.

FIG. 5B shows another example series of acts 501 in accordance with one or more embodiments. As shown in FIG. 5B, the series of acts 501 includes an act 550 of obtaining a wafer package, the wafer package including a wafer having a first base dimension and first electrical connections on a top surface of the wafer, the wafer package also including electronic component(s) having second electrical connections on a bottom surface such that there are electrical couplings between the first and second electrical connections. In one or more embodiments, the act 550 includes obtaining a wafer package having a first base dimension including a wafer having the first base dimension and having a plurality of first electrical connections on a top surface of the wafer, and one or more electronic components having a plurality of second electrical connections on a bottom surface thereof, and being positioned on the top surface of the wafer such that there are electrical couplings between the plurality of first electrical connections and the plurality of second electrical connections.

As further shown in FIG. 5B, the series of acts 501 includes an act 560 of positioning the wafer package over a base plate having a second base dimension, the wafer package covering only a portion of a top surface of the base plate such that a peripheral portion of the base plate is exposed. In one or more embodiments, the act 560 includes positioning the wafer package over a base plate having a second base dimension that is larger than the first base dimension, wherein the wafer package covers only a portion of a top surface of the base plate such that a peripheral portion of the top surface of the base plate is exposed around a perimeter of the wafer package.

As further shown in FIG. 5B, the series of acts 501 includes an act 570 of depositing a peripheral overmold over the wafer, the electronic component(s), and the exposed portion of the base plate to form a molded wafer package having the second base dimension. In one or more embodiments, the act 570 incudes depositing a peripheral overmold over the wafer, the one or more electronic components, and the exposed portion of the base plate around the perimeter of the wafer package to form a molded wafer package having the second base dimension.

In one or more embodiments, the series of acts 501 includes an act of removing the base plate from the molded wafer package such that the molded wafer package, after removal from the base plate, has the second base dimension. In one or more embodiments, the series of acts 501 includes an act of removing a layer of the molded wafer package to expose the one or more electronic components disposed on the wafer. In one or more embodiments, removing the layer includes forming a planar surface of the molded wafer package.

In one or more embodiments, the series of acts 501 includes an act of performing processing tasks on the molded wafer package using processing equipment configured to process components on a wafer structure having the second base dimension. In one or more embodiments, the processing tasks include forming through-silicon vias (TSVs) in the wafer and forming interconnects on the wafer connected to the TSVs for providing electrical power to the one or more electronic components.

In one or more embodiments, a shape of the first base dimension is a circle having a diameter of approximately eight inches. In one or more embodiments, the second base dimension is a circle having a diameter of approximately twelve inches such that the molded wafer package is a circular wafer package having a base dimension of approximately twelve inches. In one or more embodiments, the one or more electronic components includes one or more electrical integrated circuit dies, memory dies, and other electrical components capable of communicating, processing, or storing data.

FIG. 6 illustrates another series of acts 600 in accordance with one or more embodiments. As shown in FIG. 6, a series of acts 600 includes an act 610 of obtaining a wafer package, the wafer package including a wafer having a first base dimension and first electrical connections on a top surface of the wafer, the wafer package also including electronic component(s) having second electrical connections on a bottom surface such that there are electrical couplings between the first and second electrical connections. In one or more embodiments, the act 610 includes obtaining a wafer package having a first base dimension and including a wafer having a first base dimension and having a plurality of first electrical connections on a top surface of the wafer, and one or more electronic components having a plurality of second electrical connections on a bottom surface thereof, and being positioned on the top surface of the wafer such that there are electrical couplings between the plurality of first electrical connections and the plurality of second electrical connections.

As further shown in FIG. 6, the series of acts 600 includes an act 620 of positioning the wafer package within a peripheral wafer having a second base dimension, the peripheral wafer including a cutout having a size and shape corresponding to the first base dimension. In one or more embodiments, the act 620 includes positioning the wafer package within a peripheral wafer having a second base dimension that is larger than the first base dimension, wherein peripheral wafer includes a cutout, the cutout having a size and shape corresponding to the first base dimension such that the wafer package fits within the cutout.

As further shown in FIG. 6, the series of acts 600 includes an act 630 of depositing a peripheral overmold over at least a cutout portion of the peripheral wafer such that the overmold is deposited over the wafer and the electronic component(s) and forming a molded wafer package having the second base dimension. In one or more embodiments, the act 630 includes depositing a peripheral overmold over at least a cutout portion of the peripheral wafer such that the overmold is deposited over the wafer and the one or more electronic components, wherein the overmold connects the wafer and the peripheral wafer to form the molded wafer package having the second base dimension.

In one or more embodiments, the cutout is a circular cutout and the wafer fits within the cutout such that the top surface of the wafer aligns approximately with a top surface of the peripheral wafer. In one or more embodiments, the peripheral wafer is thicker than the wafer such that the top surface of the wafer is below a top surface of the peripheral wafer. In one or more embodiments, the wafer is circular and the first base dimension is a diameter of approximately eight inches. In one or more embodiments, the second base dimension has a diameter of approximately twelve inches. In one or more embodiments, the series of acts includes performing processing tasks on the molded wafer package using processing equipment configured to process components on a wafer structure having the second base dimension.

Additional details are now provided regarding circuit packages, including electro-photonic circuit packages. In particular, FIGS. 7A-7B, FIG. 8, and FIG. 9A-9B provide additional details regarding wafers, circuit packages, bidirectional photonic paths, and optical connections via an FAU.

As used herein, the term "photonic" refers to the use of light and/or photons for various applications. For instance, a "photonic path," "photonic channel," "photonic element," "photonic signal," and other similar uses operate based on the transmission of electromagnetic radiation as photons. For instance, in some cases photonic refers to the transmission, manipulation, and/or use of light, such as light in the visible spectrum, or from about 400 to about 700 nm. In some cases, photonic refers specifically to laser light. For example, in some cases photonic may include light or electromagnetic radiation in one or more of the ultraviolet spectrum (100 to 400 nm), the visible light spectrum (400 to 700 nm), or the infrared spectrum (700 nm to 1 mm). For example, in some cases herein, photons may be transmitted via a laser light source operating in any of these (or a smaller range) of wavelengths. In some cases, the term "optical" is used interchangeably herein to mean photonic.

Accordingly, a photonic path or photonic channel refers to the trajectory that photons (e.g., particles of light) follow through a medium or a device designed to guide or manipulate light. A photonic path can include waveguides, fibers, free space transmission paths, and other elements that provide precise control over photon behavior. In some instances, a photonic path includes a photonic elements which route light through a medium. In various implementations, a photonic path corresponds to both macroscopic (classical optics) and microscopic (quantum optics) manipulations of photons.

Figure 7A:
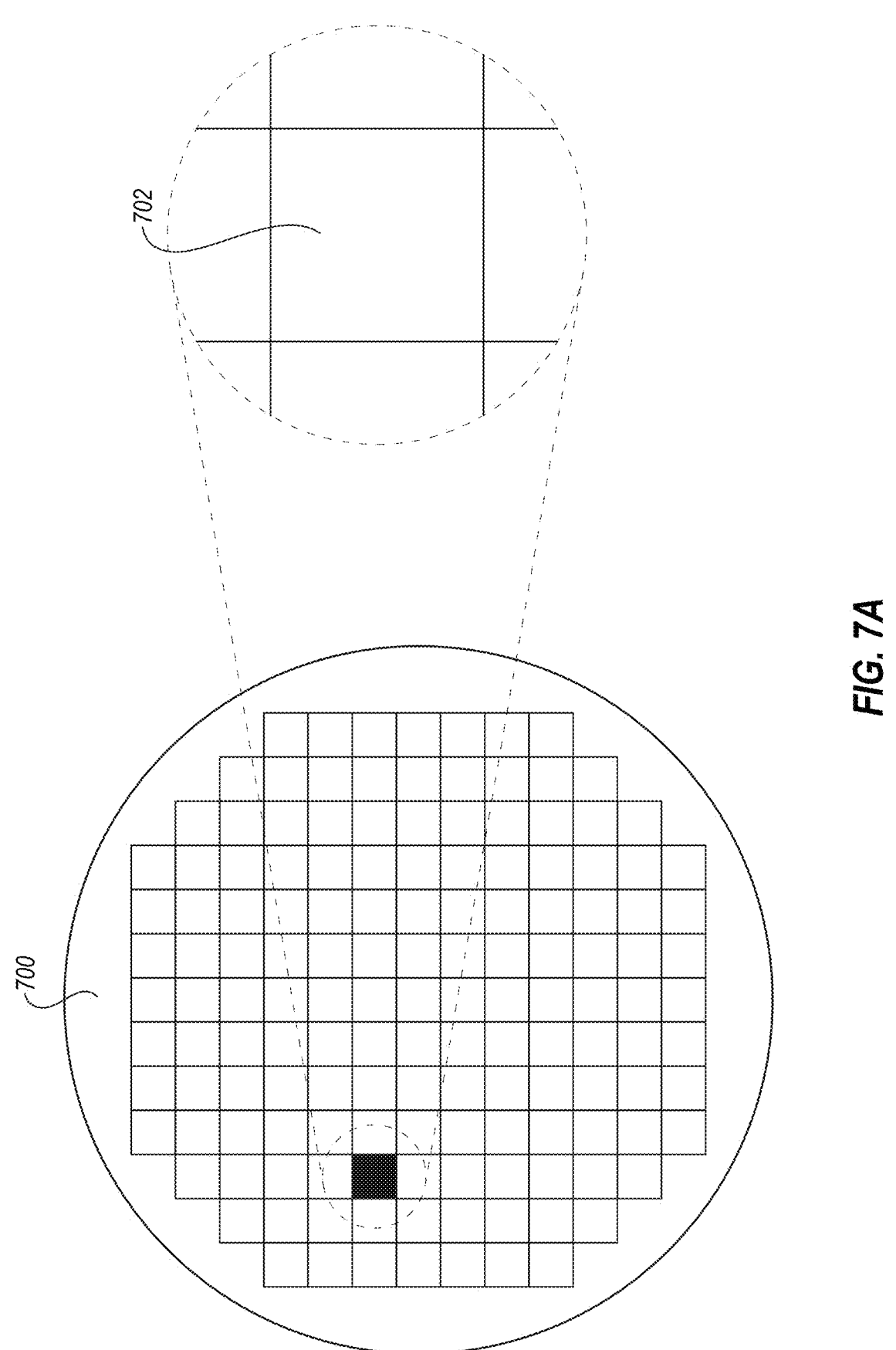
FIG. 7A illustrates a top view of a wafer and a die, which may be included in one or more circuit packages, according to at least one embodiment of the present disclosure.

In various implementations, various components of a circuit package may be created using wafers. For example, FIG. 7A corresponds to using wafers to create circuit package components according to some implementations. To illustrate, FIG. 7A shows a top view of a wafer 700 and a die 702, which may be included in one or more circuit packages (e.g., microelectronic packages).

In some instances, the wafer 700 is composed of semiconductor material and includes one or more dies having integrated circuit (IC) structures formed on the surface of the wafer 700. As shown, the wafer 700 may comprise multiple (and often many) dies, which may be copies or iterations of the same IC, or may be ICs of different variations. Each of the dies may be a unit of a semiconductor product or other hardware that includes a suitable IC. After the fabrication of the semiconductor product is complete, the wafer 700 may undergo a singulation process in which the dies are separated from one another to provide discrete "chips" of the semiconductor product. The die 702, and at least one other die, may be included in a microelectronic package with a PIC. Accordingly, a die as used herein may refer to a section or portion of a larger wafer structure having an IC formed thereon or may refer to that section or portion having been diced or cut from the wafer as a discrete chip.

A PIC can be formed in a second process using a second wafer (not shown) in a manner analogous to the fabrication of the die 702. While the die 702 may be used to fabricate electronic elements, such as EIC components, a PIC may be fabricated with optical components. In some implementations, the PIC can be embedded into a package substrate. The package substrate may be considered a cored or coreless substrate and may include one or more layers of dielectric material, which may be organic or inorganic.

The package substrate may further include one or more conductive elements, such as vias, pads, traces, microstrips, strip lines, etc. The conductive elements may be internal to, or on the surface of, the package substrate. Generally, the conductive elements may allow for the routing of signals through the package substrate or between elements coupled to the package substrate. In some implementations, the package substrate may be a printed circuit board (PCB), an interposer (e.g., an organic interposer), a motherboard, or other types of substrate.

In one or more implementations, the wafer 700 or the die 702 may include a memory device, a computing device, a storage device, or a combination thereof (examples include, but are not limited to, a random-access memory (RAM) device (such as a static RAM (SRAM) device, a magnetic RAM (MRAM) device, a resistive RAM (RRAM) device, or a conductive-bridging RAM (CBRAM) device), a logic device (e.g., an AND, OR, NAND, NOR, or EXOR gate), a NANO flash memory, a solid-state drive (SSD) memory, a NOR flash memory, a CMOS memory, a thin-film transistor-based memory, a phase-change memory (PCM), a storage class memory (SCM), a magneto-resistive memory (MRAM), a resistive RAM, a DRAM, a high bandwidth memory (HBM), a DOR-based DRAM, a DIMM memory, a CPU, a GPU, an MPU, a tensor engine, a load/store unit (LDSU), a neural compute engine, a dot-product and/or convolution engine, a field-programmable gate array (FPGA), an artificial intelligence (AI) accelerator, or any other suitable circuit element.

Multiple instances of these devices may be combined on a single die. For example, the die 702 may include a memory comprising multiple memory arrays, one or more processors, other logic, communication circuits, and power management functions. The die may operate to execute instructions stored in the memory array or otherwise interact with the memory array using the processors on die 702.

Figure 7B:
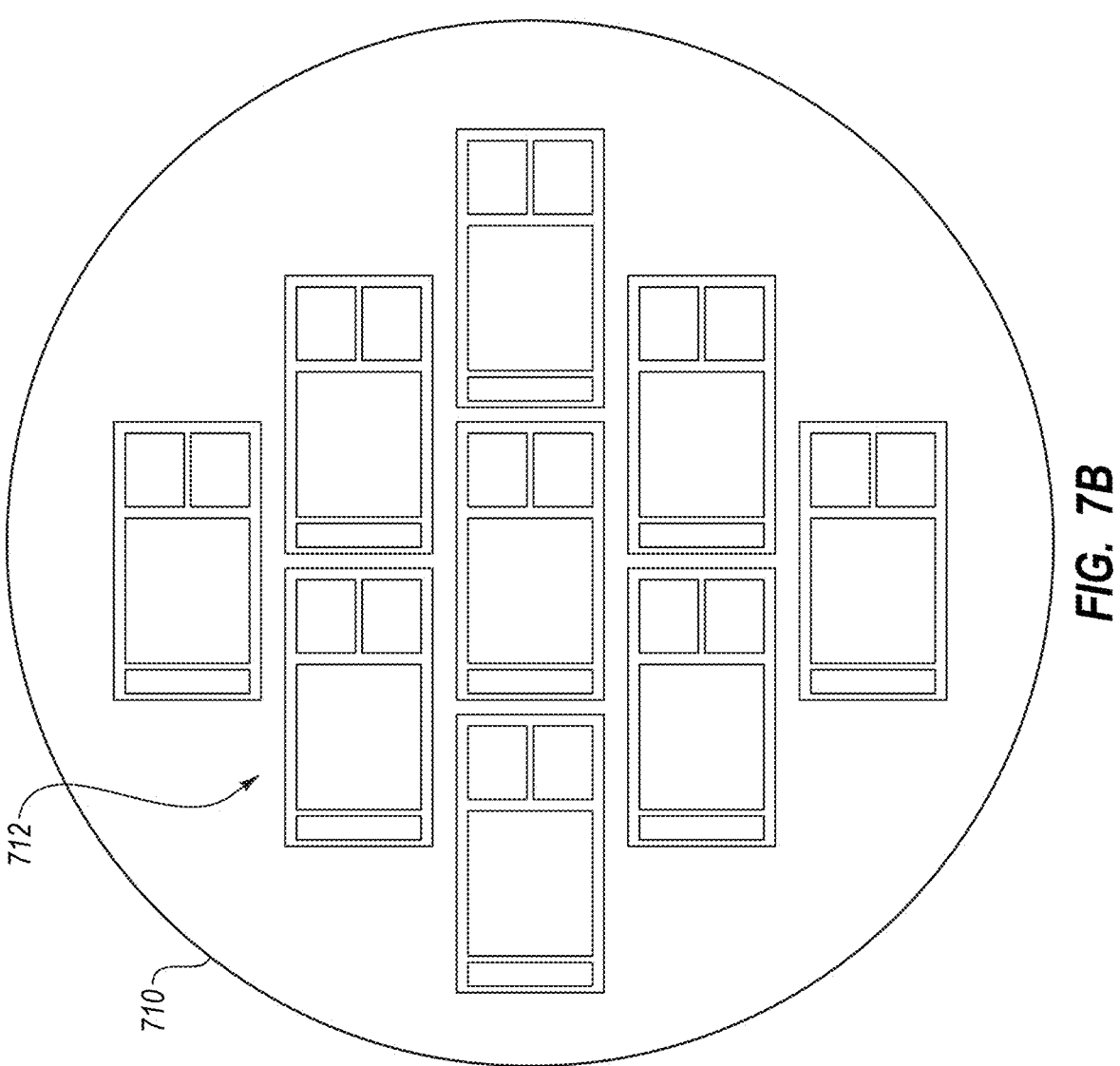
FIG. 7B illustrates a top view of a wafer having various components disposed thereon, according to at least one embodiment of the present disclosure.

As an additional example of using wafers, FIG. 7B corresponds to components formed on wafers, including one or more circuit packages according to some implementations. To illustrate, FIG. 7B shows a top view of a wafer 710 having various components disposed thereon. For example, one or more circuit packages 712 (e.g., electro-photonic circuit packages) may be formed from various electronic components disposed on a corresponding portion of the wafer 710.

In some cases, the wafer 710 may be composed of a substrate material such as silicon or another substrate material. The substrate may include one or more layers of a dielectric material, which may be organic or inorganic. The wafer 710 may be a PIC wafer having photonic components and/or an EIC wafer having electronic components. In various implementations, the wafer 710 provides various photonic interfaces, channels, photonic components, and other photonic features which, in connection with corresponding electronic components, may form one or more circuit packages 712.

Similar to the above description, the wafer 710 may further include one or more conductive elements, such as vertical interconnect accesses (vias), pads, traces, microstrips, strip lines, etc. The conductive elements may be internal to, or on the surface of, the wafer 710. Generally, the conductive elements may allow for the routing of signals (e.g., power and/or communication signals) through the wafer 710 or between elements coupled to the wafer 710. In some implementations, the wafer 710 may be a PCB, PIC substrate, an interposer (e.g., organic interposer), a motherboard, or another type of substrate.

As mentioned, the one or more circuit packages 712, including electro-photonic circuit packages, may be formed from various electronic components disposed on the wafer 710. In some cases, the electronic components are coupled to photonic components in the wafer 710. In various implementations, the one or more circuit packages 712 include a memory device, a computing device, a storage device, or a combination thereof.

Multiple instances of these examples may be combined in a circuit package. For example, a circuit package may include a memory comprising multiple memory arrays, one or more processors, other logic, communication circuits, and power management functions. Furthermore, the circuit package may execute instructions stored in the memory array or otherwise interact with the memory array using the processors on the one or more circuit packages 712.

In some cases, a single wafer may be advantageously manufactured and utilized for producing several circuit packages. For example, after the fabrication and/or assembly of the circuit packages is complete, the wafer 710 may undergo a singulation (e.g., dicing) process in which individual circuit packages are separated from one another to provide discrete "chips," as mentioned above. An electro-photonic circuit package may include any of the features and/or functionalities according to any of the circuit packages described in this document.

In some cases, each of the one or more circuit packages 712 of the wafer 710 is the same. In various implementations, one or more of the one or more circuit packages 712 (e.g., electro-photonic circuit packages) are configured differently.

In one or more implementations, the wafer 710 may be implemented in connection with various processing equipment by positioning, supporting, and/or securing the wafer 710 with respect to the processing equipment. In some cases, the processing equipment may manipulate, process, or otherwise operate on the wafer 710 as part of forming the one or more circuit packages 712, such as to form one or more TSVs at least partially through the wafer 710, to dispose, position, and/or bond dies to the wafer 710, to form overmolding on the wafer 710, or other processes.

Figure 8:
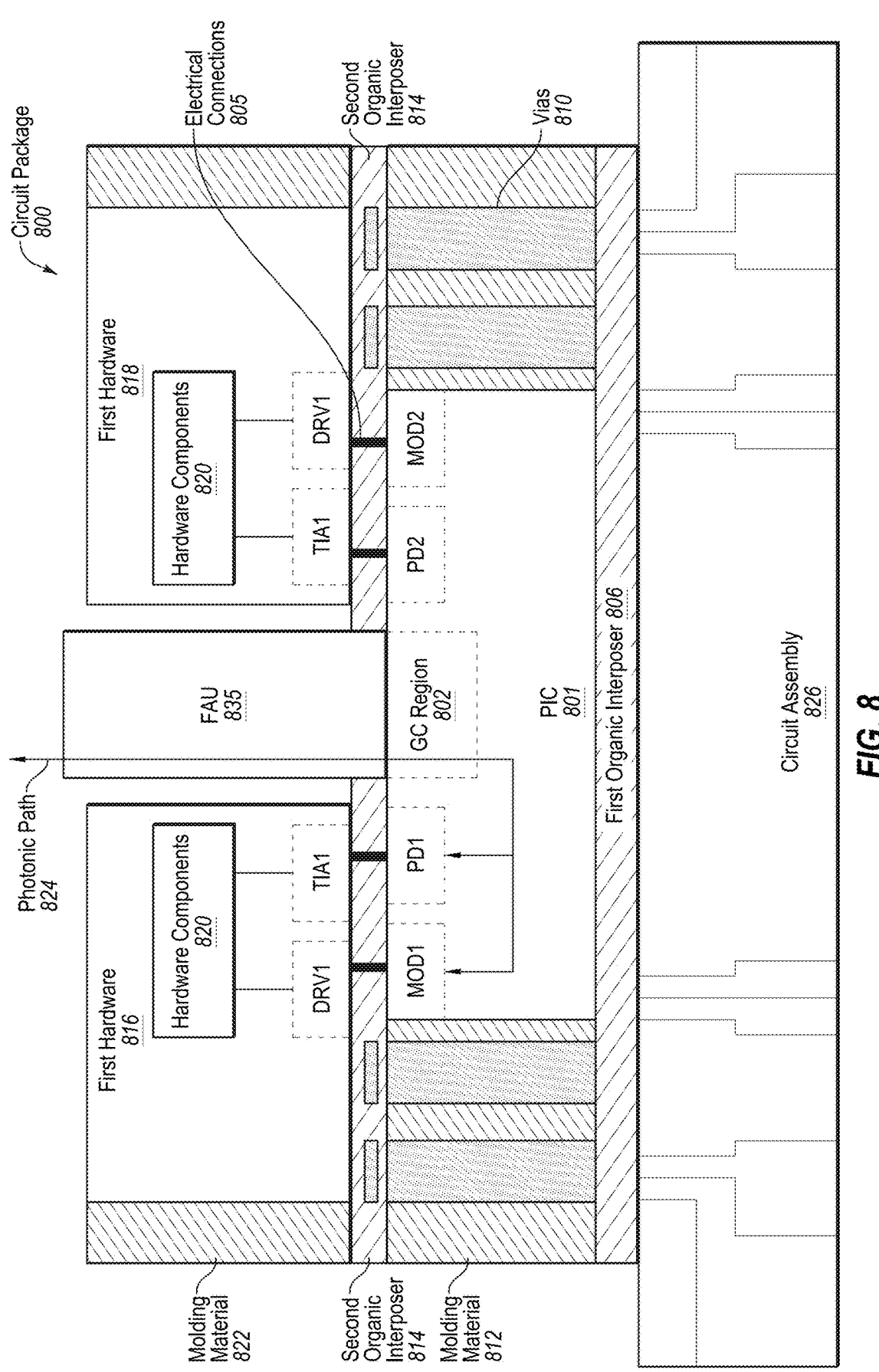
FIG. 8 illustrates an example side-view cross-section diagram of a circuit package that includes various components and that is coupled to a fiber array unit, according to at least one embodiment of the present disclosure.

As mentioned above, circuit packages can include various components and connections. To illustrate, FIG. 8 shows an example side-view cross-section diagram of a circuit package that includes various components and that is coupled to a fiber array unit. In particular, FIG. 8 illustrates an example circuit package having various PIC components and EIC components according to some implementations. While FIG. 8 provides one example implementation of a circuit package that may be used in connection with a PIC and other circuit packages described in this document, FIG. 8 is not intended to limit all circuit packages.

As shown, FIG. 8 includes a circuit package 800 with a PIC 801, a first hardware 816 (e.g., a first die), and a second hardware 818 (e.g., a second die), each having one or more hardware components 820 and/or hardware elements. As shown, the PIC 801 includes a GC region 802 that allows photonic (e.g., optical or light) signals to enter and exit the PIC 801. In many implementations, the GC region 802 is coupled to an FAU 835, which sits between an internal cavity area within a second organic interposer 814.

As shown in FIG. 8, the PIC 801 is positioned over a first organic interposer 806. The first organic interposer 806 may be a redistribution layer (RDL) that provides any number of connection structures (e.g., interconnects or connection elements) through which components of the circuit package 800 and a circuit assembly 826 (e.g., a substrate) may communicate. For example, in some instances, the circuit assembly 826 is coupled to electrical or electro-photonic components that enable electrical communications to pass between the circuit package 800 and other components that are electrically coupled to the circuit assembly 826.

The first organic interposer 806 (and organic interposer layers such as the second organic interposer 814) may refer to a layer having a variety of thicknesses and which includes one or more input/output (I/O) pads (electrical connection elements) that provide connectivity for electrical elements of the circuit package to communicate electronically with other elements of the circuit package. The organic interposer layers (e.g., the first organic interposer 806 and the second organic interposer 814) may include wiring, interconnects, and other components that enable components of the circuit package 800 to be electrically coupled to components of one or more additional electronic packages.

In various implementations, the circuit package 800 provides optically accessible co-packaged optics to connect one or more external packages to the PIC 801. Indeed, the GC region 802 couples to the FAU 835 (or another optical interface) such that some or all of a bidirectional photonic path within the circuit package 800 photonically communicates with a light engine or another external device. In turn, the bidirectional photonic path allows these external components to communicate with the hardware components (e.g., the first hardware 816 and the second hardware 818) of the circuit package 800 via a photonic path 824.

The circuit package 800 also includes vias 810 (e.g., conductive through vias such as through-silicon vias (TSVs), through-chip vias, or through-substrate vias). The vias 810 may be manufactured in any known way so electrical signals (such as power and control signals) can travel between the organic interposers. The vias 810 provide interconnectivity between different layers of an electrical system within the circuit package 800. In addition, it will be understood that while FIG. 8 illustrates four of the vias 810, the circuit package 800 may include any number of the vias 810 in various configurations. Further, while FIG. 8 illustrates a side view showing a single row of vias 810, additional vias may be manufactured toward additional axes (e.g., y-axis, z-axis) relative to the side view shown.

In some implementations, the vias 810 are formed by etching, removing, or otherwise forming a channel void, conduit, or passage, then depositing one or more conductive layers in the channel. In some cases, the vias may pass entirely from a top surface to the bottom surface of a substrate or material (e.g., an organic interposer). In some cases, the vias may connect to one or more conductive layers, such as to one or more organic interposers. In this way, the vias 810 may facilitate connecting one or more components positioned on opposite surfaces of an organic interposer, such as connecting EIC components in a hardware or die to corresponding components in a PIC opposite the organic interposer. Additionally, vias may facilitate providing power transmission to various hardware components of the electrical dies by transmitting the power from or through the bottom surface of the circuit package 800.

As further shown in FIG. 8, the circuit package 800 includes molding materials 812, 822 deposited as part of the process of manufacturing the circuit package 800. The molding materials 812, 822 may be made from a variety of materials having various properties. For example, in one or more implementations, the molding materials 812, 822 are epoxy molding compounds in a liquid form that secure elements of the circuit package 800 in place and cover certain elements contained within the structure of the circuit package 800.

As shown in FIG. 8, the circuit package 800 includes a second organic interposer 814. As mentioned above, the second organic interposer 814 may be an RDL that provides any number of connection structures (e.g., interconnects) through which components of the circuit package 800 may communicate. For example, the second organic interposer 814 includes connective elements and/or interconnects between the vias 810 and the hardware components (e.g., the first hardware 816 and the second hardware 818) within the electronic portion (e.g., the electrical layer) of the circuit package 800. The second organic interposer 814 also includes electrical connections 805 (e.g., electrical interconnects or interconnections, such as copper pillars or wires)

between the hardware components and the photonic components (e.g., MOD1, MOD2, PD1, and PD2) in the PIC 801.

As further shown in FIG. 8, the circuit package 800 includes connected hardware components (e.g., dies having EIC components) attached above the second organic interposer 814. In some implementations, the hardware components may include analog-mixed signal (AMS) blocks with components for facilitating the transmission of signals between an electronic domain and a photonic domain. For instance, the AMS blocks include photonic modulator drivers (DRV1, DRV2) for controlling associated photonic modulators (MOD1, MOD2). The modulators (MOD1, MOD2) receive photonic carrier signals and encode data into the carrier signals to transmit, via waveguides (e.g., a portion of the photonic path 824 located on the PIC 801), encoded or modulated photonic signals.

In various implementations, the AMS blocks also include transimpedance amplifiers (TIA1, TIA2) for receiving, through a connection to associated photo detectors (PD1, PD2), encoded photonic signals via one or more waveguides. In various implementations, the AMS blocks communicate with electrical hardware blocks (e.g., hardware components), which may refer to a variety of hardware blocks or dies, including EIC die(s) and/or application-specific integrated circuit (ASIC) die(s) having one or more of the components described in this document.

In one or more embodiments described herein, electrical components within the AMS blocks and connected optical components within the PIC 801 are included within respective portions of transceivers within the circuit package. For instance, in one or more embodiments described herein, an optical transmitter portion of a transceiver may include a modulator, and an electrical transmitter portion of the transceiver may include a driver. The driver may be coupled to the modulator via an interconnect. Further, an optical receiver portion of the transceiver may include a PD, and an electrical receiver portion may include a TIA. The TIA may be coupled to the PD via an interconnect.

As noted above, these respective receiver and/or transmitter portions of the transceiver may be connected via electrical connections (e.g., bumps) and electrical connection elements (e.g., electrical pads or other contacts). For example, an electrical connection element on a surface of the PIC 801 contacts electrical connection elements on a surface of electrical hardware via an electrical connection to form an electrical connection between the electrical hardware and the PIC 801. As illustrated and discussed in various embodiments, when connected, these optical and electrical portions may form electro-optical paths to and from electronic components to an optical window (e.g., the GC region 802), which enables optical signals to be received at and/or transmitted from the electrical components within a circuit package (e.g., circuit package 800).

The electrical components of the electrical dies, such as the drivers (DRV1, DRV2) and the TIAs (TIA1, TIA2), may be connected to the corresponding photonic components in the PIC 801, such as MODs (MOD1, MOD2) and PDs (MOD1, MOD2), through electrical connections 805 (e.g., electrical interconnects). For example, the electrical connections 805 may be solder bumps, copper pillars, microbumps, or other interconnects for facilitating a connection of components at the surface of a wafer.

The electrical connections 805 may be printed, deposited, or otherwise positioned on a wafer in accordance with the topography, architecture, or layout of the photonic components in the PIC 801. For instance, the electrical connections

805 may be positioned on the surface of a wafer and may form a map or guide for orienting the positioning of the electrical dies (e.g., the first hardware 816 and the second hardware 818) on a wafer. In this way, disposing, positioning, bonding, or connecting components of EIC components with each electrical hardware to the wafer may include precisely aligning the EIC components with corresponding electrical connections to form electrical connections.

As mentioned above, in various implementations, the circuit package 800 is an electro-photonic circuit package that performs one or more computing, memory, or other functionalities and may communicate (e.g., transmit and/or receive) data via photonic signals. Indeed, the circuit package 800 may facilitate intra-chip electro-photonic communication as well as inter-chip electro-photonic communication.

The circuit package 800 includes a first hardware 816 and a second hardware 818, which may include one or more hardware components 820. The first hardware 816 and the second hardware 818 may have similar or different types of hardware components. For example, the first hardware 816 includes an ASIC chip that has been programmed, customized, or otherwise configured for a particular use. The first hardware 816 may additionally or alternatively include other types of hardware components (e.g., electrical hardware components).

The second hardware 818 may include a similar or different type of hardware components as the first hardware 816. For example, in one or more implementations, the second hardware 818 includes high bandwidth memory (HBM) hardware, a CPU, a GPU, a tensor engine, a neural compute engine, or an AI accelerator. Other implementations may include other types of hardware components. In one or more implementations, one or both of the hardware components are electronic hardware components.

While not shown in the illustrated example in FIG. 8, additional components and layers may be manufactured or otherwise added onto the surface of the circuit package 800. For example, one or more additional distribution layers may be added, and additional circuitry or hardware may be connected having a similar configuration as discussed in connection with any examples discussed herein.

As mentioned, the circuit package 800 couples with the FAU 835 or another type of optical interface (O/I), which attaches to the GC region 802 of the PIC 801 of the circuit package 800. The FAU 835 allows for optical fibers to be connected to the circuit package 800. Indeed, the interface block allows for an off-chip bidirectional photonic link to be created between the package hardware and external devices. In some implementations, the FAU 835 couples one or more optical fibers for transmitting photonic signals to and/or from the PIC 801 via the GC region 802.

In some implementations, the FAU 835 and the GC region 802 may facilitate receiving and transmitting (e.g., encoded) photonic signals between the circuit package 800 and other (e.g., off-chip) circuit packages. The GC region 802 of the PIC 801 may be an optical region that utilizes a photonic path or photonic connection with the FAU 835. For example, the FAU 835 directly mounts or connects to the GC region 802 such that photonic signals are transmitted directly between GCs in the GC region 802 and corresponding optical elements in the FAU 835.

Figure 9A:
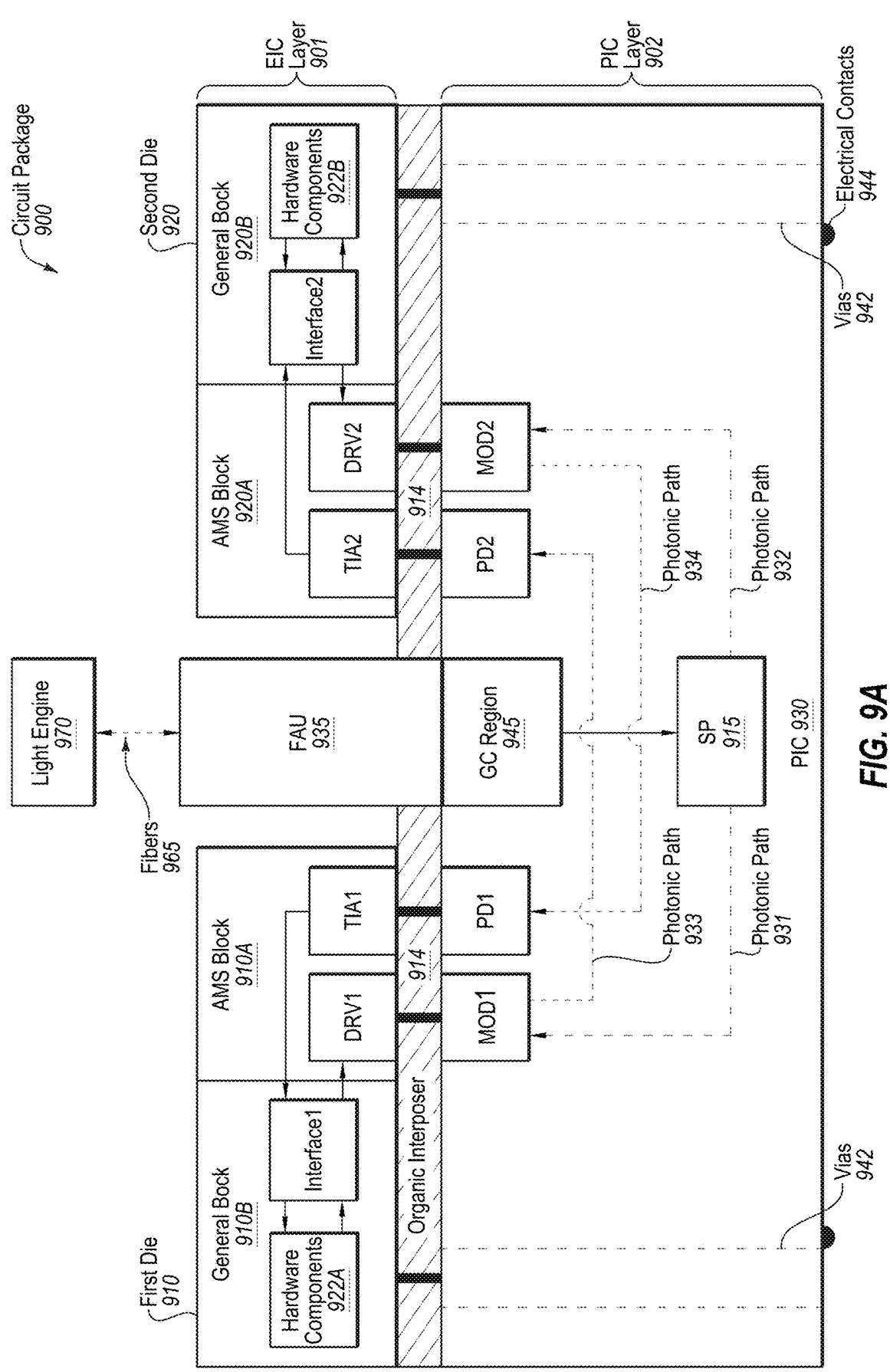
FIG. 9A illustrates an example package having a first die and a second die having intra-chip connections therebetween, according to at least one embodiment of the present disclosure.
Figure 9B:
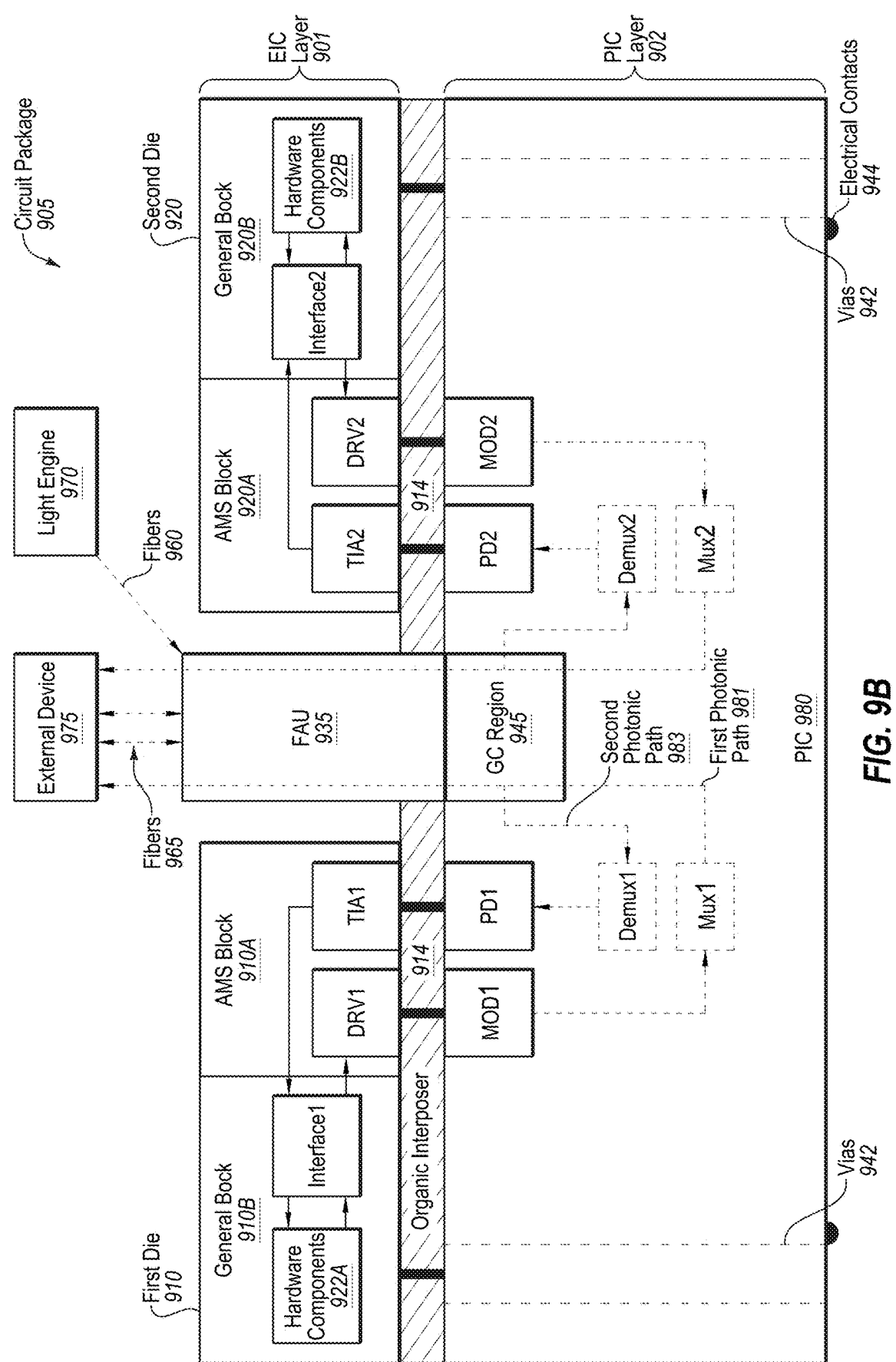
FIG. 9B illustrates an example of a circuit package with a photonic path between the circuit package and one or more external devices, which may include another circuit package, according to at least one embodiment of the present disclosure.

FIGS. 9A-9B illustrate example versions of circuit packages that create a photonic path between a circuit package and one or more circuit packages and/or external devices. Similar to the above description, the packages include a GC region (GC) within a PIC coupled to an FAU (e.g., an optical interface O/I). In some implementations, the PIC includes a GC region on the bottom surface, which enables the FAU or other optical interface component to couple to the GC region on the bottom of the PIC.

FIG. 9A shows an example package 900 having an EIC layer 901 with a first die 910 and a second die 920 having intra-chip connections therebetween. The circuit package 900 also includes a PIC layer 902 that includes the PIC 930. To illustrate, FIG. 9A shows photonic paths starting at a light engine 970 that pass through the FAU 935 and the GC region 945 to provide light to a PIC 930. Additionally, the package 900 includes a first die 910, divided into a general block 910B that may include various processing, storage, and communication functions and/or components, and an AMS block 910A that includes analog/mixed-signal circuits for interfacing with the PIC 930. The AMS block 910A of the first die 910 may include a driver (DRV1) and a transimpedance amplifier (TIA1). An AMS block 920A of the second die 920 may include a driver (DRV2) and a transimpedance amplifier (TIA2). A general block 920B of the second die 920 may include various processing, storage, and communication functions and/or components. In some instances, the package includes molding material surrounding the PIC 930 (e.g., an optical substrate).

As shown in FIG. 9A, the light engine 970 (e.g., laser light source) transmits light via fibers 960 to the FAU 935 and from the FAU 935 inside the PIC 930 via the GC region 945. In some instances, the GC region and the FAU is located on the bottom of the PIC, as described above. Once inside the PIC 930, the light travels to a splitter 915 (SP) that distributes the light over two different photonic paths 931 and 932 towards modulator MOD1 and modulator MOD2. Example modulator types include a Mach-Zehnder interferometer (MZI), ring resonator, electro-optic modulator (EOM), acousto-optic modulator (AOM), liquid crystal modulator (LCM), and digital micromirror device (DMD).

In one or more implementations, the splitter 915, or a splitter tree, distributes the light over more than two different photonic paths to additional modulators. A photonic path may be implemented with any suitable optical transmission medium and may include a mixture of waveguides, fibers, and/or free-space optical transmission paths.

Modulator MOD1 modulates the light it receives from the splitter 915 with information from driver DRV1 and transmits the modulated light to photodetector PD2 via photonic path 933. Photodetector PD2 converts the received modulated light into an electrical signal for the second die 920. Together with a serializer (not shown) in the first die 910, the driver DRV1, transimpedance amplifier TIA2, and a deserializer (not shown) in the second die 920, modulator MOD1, photonic path 933, and photodetector PD2 form a data channel, or a unidirectional electro-photonic link, from the first die 910 to the second die 920.

Similarly, modulator MOD2 modulates the light it receives from the splitter 915 with information from driver DRV2 and transmits the modulated light to photodetector PD1 via photonic path 934. Photodetector PD1 converts the received modulated light into an electrical signal for the first die 910. Together with a serializer (not shown) in the second die 920, the driver DRV2, transimpedance amplifier TIA1, and a deserializer (not shown) in the first die 910, modulator MOD2, photonic path 934, and photodetector PD1 form a data channel, or a unidirectional electro-photonic link, from the second die 920 to the first die 910.

As shown in FIG. 9A, the PIC 930 (e.g., a photonic IC) includes an organic interposer 914. The organic interposer 914 may include a bondpad pattern (e.g., an electrical connection element) located over MOD1 and PD1 that matches a bondpad pattern on the first die 910 located under DRV1 and TIA1, or is otherwise configured to form an electrical interconnection between the respective components. The organic interposer 914 may also include a bond-pad pattern located over PD2 and MOD2 that matches a bondpad pattern on the second die 920 located under TIA2 and DRV2, or is otherwise configured to form an electrical interconnection between the respective components.

Two or more bondpads of the bondpad pattern on the first die 910 are physically and electrically coupled with two or more bondpads of the bondpad pattern in the organic interposer 914. Similarly, two or more bondpads of the bondpad pattern on the second die 920 are physically and electrically coupled with two or more bondpads of the bondpad pattern in the organic interposer 914.

In one or more implementations, the connective elements (e.g., interconnects) in the organic interposer 914 connect the dies (e.g., the first die 910 and/or the second die 920) to the top surface of the PIC 930. In addition, the interconnects may be implemented using a variety of structures, including copper pillars, solder connections, pads (e.g., bondpads), bump attachments, vias, or any variety of means by which the dies may be coupled to the PIC 930.

In FIG. 9A, an electrical interconnect is shown making a coupling (or abutted coupling) between elements in the AMS blocks of the dies and the corresponding elements in the PIC 930. In one or more implementations, the interconnect is a copper pillar no longer than 2 millimeters. In one or more implementations, the copper pillar can be less than 2 millimeters and, in some instances, less than 400 microns. In other implementations, the electrical interconnects can be solder bumps made of materials such as tin, silver, or copper. If solder bumps are used for the interconnects, then the solder bumps may be flip-chip bumps. In other implementations, the interconnects may be elements of a ball-grid array (BGA), pins of a pin grid array (PGA), elements of a land grid array (LGA), or another type of interconnect. In each of these examples, the interconnects can be less than 2 millimeters and, in some cases, range from 1 to 400 microns.

In general, the interconnects have drivers (DRVs) or transimpedance amplifiers (TIAs) at one end and optical modulators (MODs) or photodetectors (PDs) at the other end. For example, in one or more implementations, the interconnects (e.g., vias such as TSVs) may physically couple with, and allow electrical signals to pass between, electrical elements (e.g., pads) of the dies and and/or the PIC 930. For instance, vias 942 pass through the PIC 930 and electrically couple to electrical contacts 944 at the bottom of the PIC 930/circuit package 900.

Additionally, in some instances, an electrical interconnect between a driver and a modulator allows the driver to provide an electrical signal that drives the modulator. In another instance, an interconnect between a transimpedance amplifier (TIA) and a photodetector allows the transimpedance amplifier to receive an electrical signal from the photodetector. In some implementations, the interconnects are such that a driver is stacked directly about a corresponding modulator with no lateral displacement between the two components and/or the two components are substantially in the same vertical column. Likewise, in some implementations, a TIA is stacked directly above a corresponding photodetector with no lateral displacement between the two components and/or the two components are substantially in the same vertical column.

The interconnects in the organic interposer may not have a uniform size, shape, or pitch. A finer pitch of interconnects may be desirable to allow a denser communication pathway between elements coupled to the PIC 930. In one or more implementations, one or more interconnects have minimal lateral displacement. For example, an interconnect is a copper pillar that is straight up and down, perpendicular to the face of a die and the PIC 930 (e.g., between 1-400 microns in length). This allows the electronic transceiver portions in the AMS block (e.g., DRV and TIA) to be directly stacked at one end of the interconnect above its respective photonic transceiver portion in the PIC (EAM and PD) at the other end of the interconnect. In some implementations, the DRV and TIA, as well as the EAM and PD, can be slightly offset from the copper pillar to reduce parasitic effects while still enabling a sub-400-micron gap (interconnect length) between heat-producing elements in the EIC/AMS and passive elements in the PIC 930.

FIG. 9B shows an example of a circuit package 905 that enables an inter-chip or inter-package connection. In particular, FIG. 9B shows a circuit package 905 (e.g., an electro-photonic circuit package) with a photonic path between the circuit package 905 and one or more external devices, which may include another circuit package. Similar to the description above, the circuit package 905 includes the GC region 945 of the PIC 980 connected to an FAU 935. The circuit package 905 includes an internal cavity area in the organic interposer 914 that enables the FAU 935 to couple directly to the GC region 945. Through the FAU 935 and the PIC 980, light signals can enter and exit the circuit package 905. For example, one or more bidirectional photonic paths through the PIC 980 allow dies connected to the PIC 980 to communicate with other external devices.

In FIG. 9B, paths for unmodulated light have been omitted in the PIC 980. Instead, FIG. 9B shows a first die 910 and second die 920 that can photonically communicate with an external device 975 (e.g., an external device optical interface) via fibers 965 (e.g., optical fibers), the FAU 935, and the PIC 980.

The first die 910 may transmit data to the external device 975 via Interface 1, DRV1, MOD1, and a first photonic path 981. As shown, the first photonic path 981 includes an optional multiplexer (MUX1) when wavelength division multiplexing is desired, a first grating coupler in the GC region 945, the FAU 935, and/or the fibers 965. Similarly, the first die 910 may receive data from the external device 975 via a second photonic path 983. The second photonic path 983 includes the fibers 965, the FAU 935, a second grating coupler in the GC region 945, and/or an optional demultiplexer when wavelength division demultiplexing is desired, PD1, TIA1, and Interface1 (I/F1). The first photonic path 981 and the second photonic path 983 (also referred to as unidirectional electro-photonic links) form a bidirectional data path between two devices on different chips.

While one or more of the above examples refer to specific types of dies, interconnects, substrates, grating couplers, and other specific elements associated with transmitting signals via respective components of the example packages, these are illustrative examples and may utilize different types of components. For example, the two (or more) dies may refer to a variety of hardware or dies and not necessarily the pairing of a general die and an AMS die as described in specific implementations herein. Indeed, the two dies may be similar types of hardware and may refer to computing hardware, processing hardware, storage hardware, memory hardware, or other hardware that is implemented on dies and may be coupled to a PIC that optically couples one or more of the dies to an external component in accordance with one or more implementations described herein.

As mentioned above, inter-chip or inter-package connections can include a photonic pathway in both directions (e.g., a bidirectional electro-photonic path), through which data may be communicated between a variety of external components (e.g., another circuit package) that are configured with the external device. In addition, it should be noted that features and functionality of the circuit package may be implemented within a variety of implementations and configurations of packages having different components, setups, and configurations.

Figure 9C:
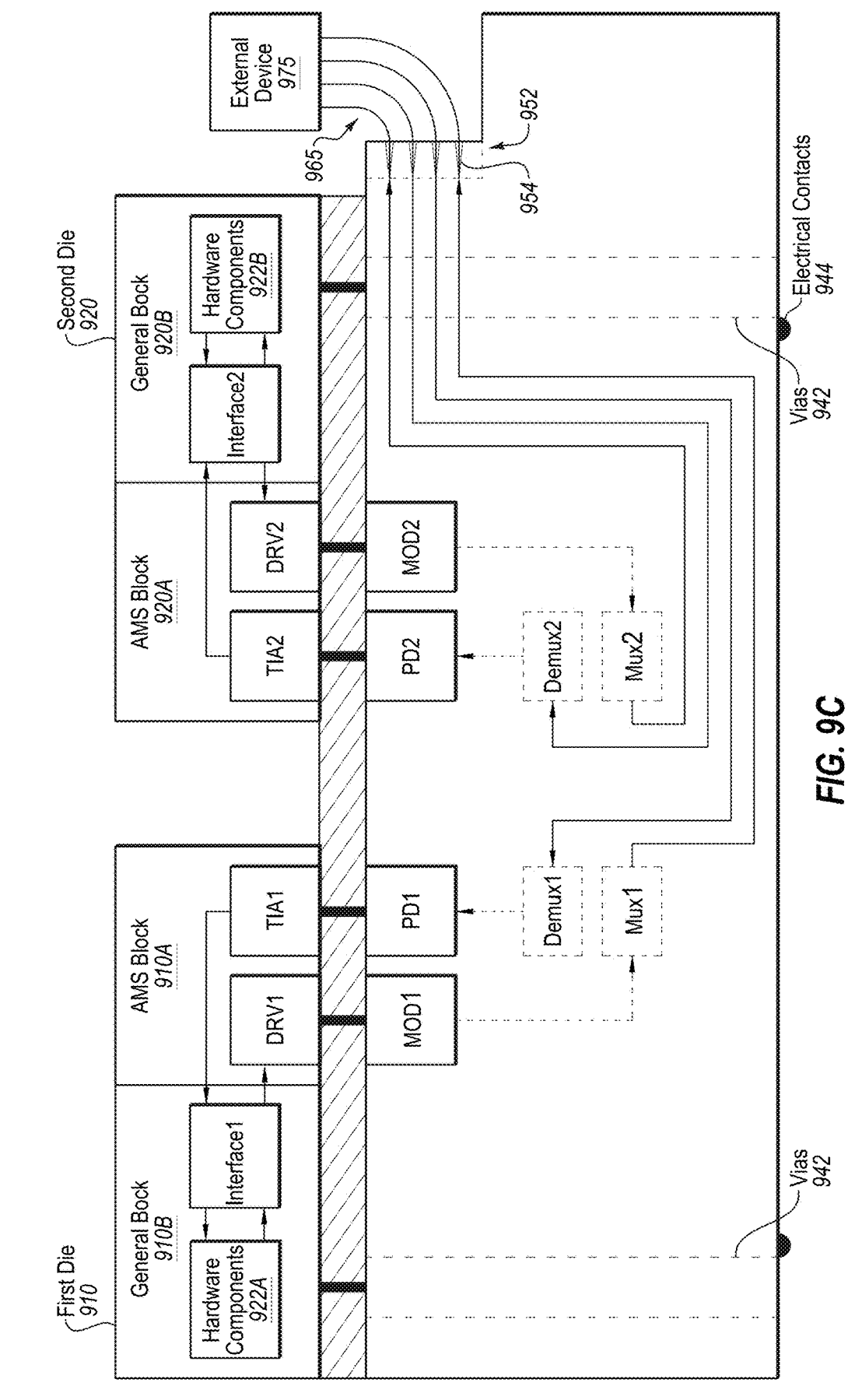
FIG. 9C illustrates an example of a circuit package having inter-chip or inter-package connections via an edge coupler, according to at least one embodiment of the present disclosure.

FIG. 9C illustrates another example of the circuit package 907 having inter-chip or inter-package connections via an edge coupler 952, according to embodiments of the present disclosure. The edge coupler 952 may be located at an edge of the PIC 980 and/or PIC layer and may facilitate photonically connecting one or more optical fibers 965 (e.g., horizontally) at the edge of the PIC 980 to photonically connect the circuit package 907 with an external device 975. For example, the edge coupler 952 may be positioned at an edge that is formed in the PIC 980 after the PIC 980 is diced to separate and/or isolate the circuit package 907 as a discrete chip from one or more other circuit packages that may be formed on a larger wafer structure.

The edge coupler 952 may include one or more (typically many) alignment features 953, such as grooves (e.g., V-grooves), slots, cutouts, or other geometries which may receive and/or align the optical fiber(s) 965 such that the optical fiber(s) 965 align with one or more waveguides within the PIC 980. For instance, these alignment features 953 may be structures which are designed with a tapered or mode-matching region, to align modes of the optical fibers 965 and the waveguides at the edge of the PIC 980 thereby reducing insertion loss and enhancing coupling efficiency therebetween. The waveguides may connect to the various photonic components of the PIC 980 in any manner described herein (e.g., including any other photonic components of the PIC 980 as described). In this way, the edge coupler 952 may provide a photonic interface for the photonic components of the PIC 980 to transmit and receive off-chip photonic signals, similar to the GC region 945 as described above.

The edge coupler 952 may be implemented in the circuit package 907 as an alternative to the GC region 945 and FAU 935, or else may be included in addition to these components. For example, in some implementations the GC 954 and the edge coupler 952 are each photonic interfaces which achieve similar objectives of facilitating photonic communication to and/or from the circuit package 907 with another device, and the circuit package 907 may be implemented with only one type of these photonic interfaces. For instance, in some cases the GC region 945 and FAU 935 may facilitate a vertical or top connection of one or more optical fibers 965, and the edge coupler 952 may facilitate a horizontal or side connection of one or more optical fibers 965. Accordingly, the GC region 945 or else the edge coupler 952 may be particularly suited for a specific implementation, space, and/or packaging requirement of the circuit package 907. In other cases, the circuit package 907 may be implemented with both the GC region 945 and the edge coupler 952, for example, for providing adaptability and connectivity to many different types of devices.

The PIC 980 and the circuit package 907 as described above may be exemplary of any of the wafers, circuit packages, wafer packages, or other connections and/or collections of components as described in any of the embodiments herein. For example, various embodiments herein may be described as having a wafer, PIC, PIC wafer, substrate, dies, EIC, etc., and it should be understood that any of these embodiments (e.g., and others described herein) may be implemented having any of the features, components, or configurations as described in FIGS. 7A-9C. For instance, in cases where an electronic component, die, EIC, chip, etc., is described as being connected to, coupled to, positioned on, disposed on, bonded to, etc., in connection with a PIC or PIC wafer (or the like), it should be understood that such components are positioned with respect to photonic components in the PIC wafer and correspondingly connected to the same via electronic interconnects.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or processing process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method of making a wafer structure having a desired base dimension, comprising;

obtaining a photonic integrated circuit (PIC) wafer having a first base dimension, the desired base dimension being larger than the first base dimension, the PIC wafer comprising:

an optical region near a top surface of the PIC wafer configured to allow light to enter and exit the PIC wafer;

optical transmitter and receiver portions in optical communication with the optical region, the optical transmitter and receiver portions having electrical interconnects to the top surface of the PIC wafer in a portion that does not extend into the optical region; and one or more electronic components including electrical transmitter and receiver portions interconnected with the optical transmitter and receiver portions via electrical interconnects, forming electro-optical paths to and from the one or more electronic components to the optical region;

positioning the PIC wafer on a base plate having a base dimension that is the desired base dimension, wherein the PIC wafer covers only a portion of a top surface of the base plate such that a portion of the top surface of the base plate is exposed around a perimeter of the PIC wafer; and depositing an overmold over the PIC wafer, the one or more electronic components, and the exposed portion of the base plate around the perimeter of the PIC wafer, thereby forming a wafer structure having the desired base dimension;

removing a layer of the overmold, thereby exposing the one or more electronic components disposed on the PIC wafer, wherein removing the layer of the overmold exposes an optical path to the optical region near the top surface of the PIC wafer.

2. The method of claim 1, further comprising removing the base plate from the wafer structure, thereby releasing the wafer structure from the base plate.

3. The method of claim 1, further comprising coupling an optical fiber to a grating coupler in the optical region using an optical interface component.

4. The method of claim 3, wherein the optical interface component is a fiber array unit (FAU).

5. The method of claim 1, further comprising performing tasks on the wafer structure using processing equipment configured to process wafers having the desired base dimension.

6. The method of claim 5, wherein the processing tasks include forming through-silicon vias (TSVs) in the PIC wafer and forming interconnects on the PIC wafer connected to the TSVs for providing electrical power to the one or more electronic components.

7. The method of claim 1, wherein a shape of the PIC wafer is a disk having a diameter of approximately eight inches.

8. The method of claim 7, wherein a shape of the wafer structure is a disk having a diameter of approximately twelve inches.

9. The method of claim 1, wherein the PIC wafer comprises waveguides formed within the PIC wafer and passing between the optical region and the optical transmitter and receiver portions.

10. The method of claim 1, wherein the electrical interconnects comprise connections through bumps on the top surface of the PIC wafer; and the method further comprises disposing the one or more electronic components on the PIC wafer before obtaining the PIC wafer, wherein disposing the one or more electronic components comprises attaching the one or more electronic components to the bumps on the top surface of the PIC wafer.

* * * * *